(12) United States Patent
Kimura

(10) Patent No.: US 6,867,650 B2
(45) Date of Patent: Mar. 15, 2005

(54) VARIABLE GAIN AMPLIFIER CIRCUIT

(75) Inventor: Katsuji Kimura, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 127 days.

(21) Appl. No.: 10/314,603

(22) Filed: Dec. 9, 2002

(65) Prior Publication Data

US 2003/0107438 A1 Jun. 12, 2003

(30) Foreign Application Priority Data

Dec. 10, 2001 (JP) ........................................ 2001-375812

(51) Int. Cl.[7] .............................. H03F 3/45; H03G 5/16

(52) U.S. Cl. ...................................... 330/254; 330/133

(58) Field of Search ................................. 330/254, 133

(56) References Cited

U.S. PATENT DOCUMENTS

| | | | | |
|---|---|---|---|---|
| 5,581,212 A | * | 12/1996 | Huang et al. ............... | 330/253 |
| 5,757,230 A | | 5/1998 | Mangelsdorf | |
| 5,815,039 A | | 9/1998 | Kimura | |
| 5,880,631 A | * | 3/1999 | Sahota ......................... | 330/51 |
| 5,886,579 A | | 3/1999 | Mangelsdorf | |
| 6,201,443 B1 | | 3/2001 | Tanji | |
| 6,278,321 B1 | | 8/2001 | Franck | |
| 6,657,488 B1 | * | 12/2003 | King et al. ..................... | 330/9 |

FOREIGN PATENT DOCUMENTS

| | | |
|---|---|---|
| GB | 2280073 A | 1/1995 |
| JP | 4-109705 | 4/1992 |
| JP | 05-114836 | 5/1993 |
| JP | 2000-68761 | 3/2000 |

OTHER PUBLICATIONS

Japanese Office Action of Jun. 8, 2004.
English Translations of the indicated portions of the above-referenced Japanese Action.
"A 3.3–V CMOS Wideband Exponential Control Variable–Gain–Amplifier" IEEE 1998.
United Kingdom Combined Search and Examination Report, Sep. 2, 2003.
Wittlinger, Hal, "Applications of the CA3080 High Performance Operational Transconductance Amplifiers", Intersil Corporation, 2002.
Grise, W., "Application of the Operational Transconductance Amplifier (OTA) to Voltage–controlled Amplifiers and Active Filters", Internet: http://et.nmsu.edu/~etti/winter98/electronics/grise/wrg.html.

* cited by examiner

*Primary Examiner*—Patricia Nguyen
(74) *Attorney, Agent, or Firm*—Darryl G. Walker; Bradley T. Sako

(57) ABSTRACT

A variable gain amplifier circuit (100) that may have a gain exponentially changed has been disclosed. A variable gain amplifier circuit (100) may include a first OTA (Operational Transconductance Amplifier) (11) and a second OTA (12). A first OTA (11) may receive a differential voltage at input terminals (IN1 and IN2). A second OTA (12) may receive an output from a first OTA (11) and may provide a differential output voltage at output terminals (OUT1 and OUT2). A second OTA (12) may have second OTA input terminals and second OTA output terminals commonly connected to output terminals (OUT1 and OUT2). A small-signal transconductance of the first and second OTAs (11 and 12) may be proportional to driving currents. A first OTA (11) may have a driving current of $I_0\{1+\tan h(x/a)\}$ and a second OTA (12) may have a driving current of $I_0\{1-\tan h(x/a)\}$, where $-1<x<1$ and a is a constant. In this way, a variable gain amplifier circuit (100) may operate at a low voltage, with a small circuit current, and with essentially no temperature dependence.

32 Claims, 14 Drawing Sheets

| dB(target value) | 1+tanh(x/a) | 1-tanh(x/a) | dB (implementation value) | Error(dB) |
|---|---|---|---|---|
| -6 | 0.4015257 | 1.5984743 | -5.9999238 | 7.62E-05 |
| -5.5 | 0.4397463 | 1.5602537 | -5.4999301 | 6.99E-05 |
| -5 | 0.4805115 | 1.5194885 | -4.9999365 | 6.35E-05 |
| -4.5 | 0.523787 | 1.476213 | -4.4999428 | 5.72E-05 |
| -4 | 0.5694993 | 1.4305007 | -3.9999492 | 5.08E-05 |
| -3.5 | 0.6175321 | 1.3824679 | -3.4999555 | 4.45E-05 |
| -3 | 0.6677251 | 1.3322749 | -2.9999619 | 3.81E-05 |
| -2.5 | 0.7198734 | 1.2801266 | -2.4999682 | 3.18E-05 |
| -2 | 0.7737291 | 1.2262709 | -1.9999746 | 2.54E-05 |
| -1.5 | 0.8290048 | 1.1709952 | -1.4999809 | 1.91E-05 |
| -1 | 0.8853782 | 1.1146218 | -0.9999873 | 1.27E-05 |
| -0.5 | 0.9424996 | 1.0575004 | -0.4999936 | 6.35E-06 |
| 0 | 1 | 1 | 0 | 0 |
| 0.5 | 1.0575004 | 0.9424996 | 0.49999365 | -6.40E-06 |
| 1 | 1.1146218 | 0.8853782 | 0.99998729 | -1.30E-05 |
| 1.5 | 1.1709952 | 0.8290048 | 1.49998094 | -1.90E-05 |
| 2 | 1.2262709 | 0.7737291 | 1.99997459 | -2.50E-05 |
| 2.5 | 1.2801266 | 0.7198734 | 2.49996824 | -3.20E-05 |
| 3 | 1.3322749 | 0.6677251 | 2.99996188 | -3.80E-05 |
| 3.5 | 1.3824679 | 0.6175321 | 3.49995553 | -4.4E-05 |
| 4 | 1.4305007 | 0.5694993 | 3.99994918 | -5.10E-05 |
| 4.5 | 1.476213 | 0.523787 | 4.49994282 | -5.70E-05 |
| 5 | 1.5194885 | 0.4805115 | 4.99993647 | -6.40E-05 |
| 5.5 | 1.5602537 | 0.4397463 | 5.49993012 | -7.00E-05 |
| 6 | 1.5984743 | 0.4015257 | 5.99992377 | -7.60E-05 |

FIG. 13

VARIABLE GAIN AMPLIFIER CIRCUIT

TECHNICAL FIELD

The present invention relates generally to a variable gain amplifier circuit and more particularly to a variable gain amplifier circuit formed on a semiconductor integrated circuit that may be operable at a low voltage with small current, may have a gain exponentially changed in response to a control signal, and may have reduced variations due to temperature changes.

BACKGROUND OF THE INVENTION

Conventional variable gain amplifiers are disclosed in U.S. Pat. No. 5,757,230 (5,757,230) published May 23, 1998 and U.S. Pat. No. 5,886,579 (5,886,579) published Mar. 23, 1999.

In general, a variable gain amplifier is abbreviated as a VGA. Up to now, approximation methods of implementing the exponential characteristic have been well-known, including an approximation method using Taylor's expansion.

$$e^x \approx 1 + x + \frac{1}{2}x^2 \quad (1)$$

and an approximation method using the bilinear transformation $$e^x \approx \frac{1+x}{1-x}. \quad (2)$$

Referring now to FIG. 16, a graph illustrating the relationship between the true exponential characteristic (exp(x)) and the expressions of expressions (1) and (2) is set forth.

As seen from FIG. 16, the slope for expression (2) is inconsistent and thus not a correct approximation of exp(x). A better expression is $$e^{2x} \approx \frac{1+x}{1-x}. \quad (3)$$

In the conventional VGA described in U.S. Pat. Nos. 5,757,230 and 5,886,579, the exponential characteristic is approximated using the bilinear transformation as shown in expression (2) and better approximated in expression (3). The conventional variable gain amplifier show in the above-mentioned publications will now be described.

Referring now to FIG. 17, a circuit schematic diagram of a conventional variable gain amplifier (VGA) is set forth and given the general reference character 1700. Conventional VGA 1700 is described in the above-mentioned U.S. Pat. Nos. 5,757,230 and 5,886,579.

In conventional VGA 1700, a gain controller 1710 receives a gain control signal X as a voltage and provides a control signal C1 as a voltage input to an operational transconductance amplifier (OTA) 1720. Because gain control signal X is a voltage input and control signal C1 is a voltage input, OTA 1720 is a multiplier having a voltage input. OTA 1720 as a multiplier is shown in FIG. 18 (FIG. 2 of U.S. Pat. No. 5,757,230).

Referring to FIG. 18, a circuit schematic diagram of a conventional multiplier is set forth and given the general reference character 1800. Conventional multiplier 1800 is used as OTA 1720 in conventional VGA 1700.

Conventional multiplier 1800 includes MOS (metal-oxide-semiconductor) transistors (M1A, M1B, M2A, and M2B). Drain currents ($I_{D1A}$, $I_{D2A}$, $I_{D1B}$, and $I_{D2B}$) of MOS transistors (M1A, M1B, M2A, and M2B), respectively, comprising conventional multiplier 1800 are represented such that:

$$I_{D1A} = \beta \left( V_{CM} + \frac{V_{IN}}{2} - V_S - V_{TH} \right)^2 \quad (4)$$

$$I_{D1B} = \beta \left( V_{CM} + \frac{V_{IN}}{2} - V_B - V_S - V_{TH} \right)^2 \quad (5)$$

$$I_{D2A} = \beta \left( V_{CM} + \frac{V_{IN}}{2} - V_S - V_{TH} \right)^2 \quad (6)$$

$$I_{D2B} = \beta \left( V_{CM} + \frac{V_{IN}}{2} - V_B - V_S - V_{TH} \right)^2 \quad (7)$$

Herein, $\beta$ is a transconductance parameter of MOS transistors (M1A, M1B, M2A, and M2B) and represented as $\beta = \mu(COX/2)(W/L)$, where $\mu$ is the effective mobility of carriers, COX is the gate oxide film capacitance per unit area, W is the gate width, and L is the gate length of the respective MOS transistors (M1A, M1B, M2A, and M2B). Also, in expressions (4) to (7), $V_{IN}$ is the input voltage, $V_{CM}$ is the input common mode voltage, $V_{TH}$ is the threshold voltage, and $V_S$ is the common source voltage. In FIG. 18, the gate voltages of MOS transistors (M1A, M1B, M2A, and M2B) are $V_{CM}+V_{IN}/2$, $V_{CM}+V_{IN}/2-V_B$, $V_{CM}+V_{IN}/2$, and $V_{CM}+V_{IN}/2-V_B$, respectively. Supposing that the gate-source voltage is $V_{GS}$, the above expressions (4) to (7) are derived from the drain current $I_D = (V_{GS}-V_{TH})^2$.

When the sources of MOS transistors (M1A, M1B, M2A, and M2B) are commonly connected and driven by a current $I_0$, the conditional expression results $$I_{D1A}+I_{D1B}+I_{D2A}+I_{D2B}=I_0 \quad (8)$$

When the source is grounded, the conditional expression (8) is unnecessary.

Solving expression (8) using expressions (4) to (7), $$I_{D1B} + I_{D2A} = \frac{I_0}{2} - \beta V_{IN} V_B \left( V_{IN}^2 + V_B^2 + |V_{IN} V_B| \le \frac{I_0}{2\beta} \right) \quad (9)$$

$$I_{D1A} + I_{D2B} = \frac{I_0}{2} - \beta V_{IN} V_B \left( V_{IN}^2 + V_B^2 + |V_{IN} V_B| \le \frac{I_0}{2\beta} \right) \quad (10)$$

can be obtained. Expressions (9) and (10) represent the current characteristics within the linear operation range of MOS transistors (M1A, M1B, M2A, and M2B).

FIG. 19 is a graph illustrating the linear operation obtained. When the source is grounded, conditions as indicated within the parentheses in expressions (9) and (10) are unnecessary.

From the above, a circuit analysis for a conventional multiplier 1800 employed in the conventional VGA 1700 as described in the above-mentioned U.S. Patents is made. FIG. 20 is a circuit schematic diagram showing the conventional VGA using a multiplier as the OTA (see FIG. 3 of U.S. Pat. No. 5,757,230).

In a second OTA 2020 shown in FIG. 20, the sources of four MOS transistors (M3A, M3B, M4A, and M4B) are grounded. However, because a constant current source 10 is connected between the power supply VDD and the drains, the second OTA 2020 has the sum of current flowing through the four MOS transistors (M3A, M3B, M4A, and M4B) which is equal to a constant value $I_0$.

Accordingly, the conditions indicated within parentheses ( ) in expressions (9) and (10) are applied to the second OTA 2020 consisting of four MOS transistors (M3A, M3B, M4A, and M4B) having grounded sources.

Also, a control voltage $V_{BF}$ is applied to the conventional multiplier comprising a first OTA 2010 and a control voltage $V_{BB}$ is applied to the conventional multiplier comprising the second OTA 2020. If the control voltages $$V_{BF} \propto 1+x \tag{11}$$

$$V_{BB} \propto 1-x \tag{12}$$

are applied, the voltage gain of the VGA is represented as $$G_v = \frac{1+x}{1-x} \tag{13}$$

and the bilinear transformation as indicated in expression (2) can be realized. When represented in dB (decibel), the bilinear transformation as indicated in expression (2) can be approximated by the exponential characteristic ($e^{2x}$) with a slope of double $e^x$.

As described above, in a conventional VGA with the gain changed exponential by a control signal in this manner, by using an OTA as a multiplier of an inputted voltage, when the control voltage is increased, the available input voltage range is narrowed by a corresponding amount. Therefore, in that above-mentioned conventional VGA, it is required to provide a wide input voltage range for the multiplier by setting the tail current to a large value in order to keep the variable width of voltage gain in the VGA. Thus, it is difficult to decrease the driving current.

In view of the above discussion, it would be desirable to provide a variable gain amplifier (VGA) circuit that may have a gain changed exponentially in response to a control signal and may be operable at a low voltage with a small circuit current. It would also be desirable to provide a VGA circuit that may have reduced variations due to temperature. It would also be desirable to provide a VGA circuit that may have a simple circuit configuration and may consume less chip area.

SUMMARY OF THE INVENTION

According to the present embodiments, a variable gain amplifier circuit that may have a gain exponentially changed is disclosed. A variable gain amplifier circuit may include a first OTA (Operational Transconductance Amplifier) and a second OTA. A first OTA may receive a differential voltage at input terminals. A second OTA may receive an output from a first OTA and may provide a differential output voltage at output terminals. A second OTA may have second OTA input terminals and second OTA output terminals commonly connected to output terminals. A small-signal transconductance of the first and second OTAs may be proportional to driving currents. A first OTA may have a driving current of $I_0\{1+\tan h(x/a)\}$ and a second OTA may have a driving current of $I_0\{1-\tan h(x/a)\}$, where $-1<x<1$ and a is a constant. In this way, a variable gain amplifier circuit may operate at a low voltage, with a small circuit current, and with essentially no temperature dependence.

According to one aspect of the embodiments, a variable gain amplifier circuit may include a first OTA and a second OTA. A first OTA may provide an electric current essentially proportional to a differential input voltage. A second OTA may accept the electric current of the first OTA and may convert current to voltage. The second OTA may include a second OTA input terminal connected to a second OTA output terminal. An output voltage level may be increased by making a driving current of the first OTA less or a driving current of the second OTA more.

According to another aspect of the embodiments, a first transconductance of a first OTA may be essentially proportional to a square root of a first driving current of a first OTA. A second transconductance of a second OTA may be essentially proportional to a square root of a second driving current of the second OTA.

According to another aspect of the embodiments, a first transconductance of a first OTA may be essentially proportional to a first drive current of a first OTA. A second transconductance of a second OTA may be essentially proportional to a second drive current of the second OTA.

According to another aspect of the embodiments, the size of transistors in the first OTA may be different from the size of transistors in the second OTA.

According to another aspect of the embodiments, a variable range of a first driving current of the first OTA may be different from a variable range of a second driving current of the second OTA.

According to another aspect of the embodiments, at least one of the first OTA or the second OTA may include a plurality of OTAs arranged in parallel.

According to another aspect of the embodiments, a substantial portion of a variable component of a first driving current of the first OTA may be varied in accordance with a hyperbolic tangent function (tan h(x/a), where a is a constant). A substantial portion of a variable component of a second driving current of the second OTA may be varied in accordance with a hyperbolic tangent function (tan h(x/a)).

According to another aspect of the embodiments, a substantial portion of the variable component of a first driving current of the first OTA may be varied discretely in accordance with discrete values of a hyperbolic tangent function. A substantial portion of the variable component of a second driving current of the second OTA may be varied discretely with discrete values of a hyperbolic tangent function.

According to another aspect of the embodiments, a variable gain amplifier circuit may include a first OTA and a second OTA. A first OTA may include first and second input terminals connected to receive a differential input voltage. A second OTA may include a third input terminal for receiving a first current from a first output terminal of the first OTA and a fourth input terminal for receiving a second current from a second output terminal of the first OTA. The second OTA may include a third output terminal connected to the third input terminal and a fourth output terminal connected to the fourth input terminal. The first OTA may have a small-signal transconductance proportional to a first driving current of the first OTA and the second OTA may have a small-signal transconductance proportional to a second driving current of the second OTA and a voltage gain may be varied by varying at least one of the first driving current or the second driving current.

According to another aspect of the embodiments, a variable gain amplifier circuit may include a plurality of switches connected in series with a plurality of current sources for varying the first driving current and the second driving current. First and second OTAs may be provided with essentially constant currents having a first current value and a second current value, a voltage gain may be varied discretely by varying the first driving current or the second driving current with the plurality of swithes.

According to another aspect of the embodiments, a sum of current values switched by a plurality of switches and varying discretely the first driving current and second driving current may be such that the first driving current is essentially discrete values of $I_{01}\{1+\tan h(x/a)\}$, and the second driving current is essentially discrete values of $I_{02}\{1-\tan h(x/a)\}$ ($I_{01}$ and $I_{02}$ are essentially constant current values, tan h is a hyperbolic tangent function, a is a constant, and x is a variable in the range $-1<x<1$).

According to another aspect of the embodiments, 10, and 102 may be essentially the same value.

According to another aspect of the embodiments, the first OTA may have a small-signal transconductance proportional to a square root of a first driving current of the first OTA and the second OTA may have a small-signal transconductance proportional to a square root of a second driving current of the second OTA and a voltage gain may be varied by varying at least one of the first driving current or the second driving current.

According to another aspect of the embodiments, a variable gain amplifier circuit may include a first OTA and a second OTA. A first OTA may include first and second input terminals connected to receive a differential input voltage. A second OTA may include a third input terminal for receiving a first current from a first output terminal of the first OTA and a fourth input terminal for receiving a second current from a second output terminal of the first OTA. The second OTA may include a third output terminal connected to the third input terminal and a fourth output terminal connected to the fourth input terminal. The first OTA may have a small-signal transconductance proportional to a square root of a first driving current of the first OTA and the second OTA may have a small-signal transconductance proportional to a square root of a second driving current of the second OTA and a voltage gain may be varied by varying at least one of the first driving current or the second driving current. If the first driving current is $I_{01}(1+x)$, and the second driving current is $I_{02}(1-x)$ ($I_{01}$ and $I_{02}$ are essentially constant current values, and x is a variable in the range $-1<x<1$), a voltage gain $G_V$ is given such as $$G_v = \sqrt{\frac{I_{01}(1+x)}{I_{02}(1-x)}}$$

or may have a value essentially proportional to the above value of $G_V$.

According to another aspect of the embodiments, a variable gain amplifier circuit may include a first OTA and a second OTA. A first OTA may include first and second input terminals connected to receive a differential input voltage. A second OTA may include a third input terminal for receiving a first current from a first output terminal of the first OTA and a fourth input terminal for receiving a second current from a second output terminal of the first OTA. The second OTA may include a third output terminal connected to the third input terminal and a fourth output terminal connected to the fourth input terminal. The first OTA may have a small-signal transconductance proportional to a first driving current of the first OTA and the second OTA may have a small-signal transconductance proportional to a second driving current of the second OTA and a voltage gain may be varied by varying at least one of the first driving current or the second drive current. If the first drive current is $I_{01}(1+x)$, and the second drive current is $I_{02}(1-x)$ ($I_{01}$ and $I_{02}$ are essentially constant current values, and x is a variable in the range $-1<x<1$), a voltage gain $G_V$ is given such as $$G_v = \frac{I_{01}(1+x)}{I_{02}(1-x)}$$

or may have a value essentially proportional to the above value of $G_V$.

According to another aspect of the embodiments, a variable gain amplifier circuit may include a first OTA and a second OTA. A first OTA may include first and second input terminals connected to receive a differential input voltage. A second OTA may include a third input terminal for receiving a first current from a first output terminal of the first OTA and a fourth input terminal for receiving a second current from a second output terminal of the first OTA. The second OTA may include a third output terminal connected to the third input terminal and a fourth output terminal connected to the fourth input terminal. The first OTA may have a first small-signal transconductance proportional to a first driving current of the first OTA and the second OTA may have a second small-signal transconductance proportional to a second driving current of the second OTA and a voltage gain may be varied by varying at least one of the first drive current or the second drive current and if the first driving current is $I_{01}\{1+\tan h(x/a)\}$, and the second driving current is $I_{02}\{1-\tan h(x/a)\}$ ($I_{01}$ and $I_{02}$ are essentially constant current values, tan h is a hyperbolic tangent function, a is a constant, and x is a variable in the range $-1<x<1$), a voltage gain $G_V$ is given such as $$G_v = \sqrt{\frac{I_{01}\{1+\tanh\left(\frac{x}{a}\right)\}}{I_{02}\{1-\tanh\left(\frac{x}{a}\right)\}}}$$

or may have a value essentially proportional to the above value of $G_V$.

According to another aspect of the embodiments, a variable gain amplifier circuit may include a first QTA and a second OTA. A first OTA may include first and second input terminals connected to receive a differential input voltage. A second OTA may include a third input terminal for receiving a first current from a first output terminal of the first OTA and a fourth input terminal for receiving a second current from a second output terminal of the first OTA. The second OTA may include a third output terminal connected to the third input terminal and a fourth output terminal connected to the fourth input terminal. The first OTA may have a first small-signal transconductance proportional to a first driving current of the first OTA and the second OTA may have a second small-signal transconductance proportional to a second driving current of the second OTA and a voltage gain may be varied by varying at least one of the first driving current or the second drive current and if the first drive current is $I_{01}\{1+\tan h(x/a)\}$, and the second driving current is $I_{02}\{1-\tan h(x/a)\}$ ($I_{01}$ and $I_{02}$ are essentially constant current values, tan h is a hyperbolic tangent function, a is a constant, and x is a variable in the range −1<x<1), a voltage gain $G_V$ is given such as $$G_v = \frac{I_{01}\left\{1 + \tanh\left(\frac{x}{a}\right)\right\}}{I_{02}\left\{1 - \tanh\left(\frac{x}{a}\right)\right\}}$$

or may have a value essentially proportional to the above value of $G_V$.

According to another aspect of the embodiments, a variable gain circuit may include a first OTA and a second OTA. A first OTA may have a first IGFET (insulated gate field effect transistor) and a second IGFET. A first IGFET source and a second IGFET source may be commonly connected to a first current source. A first IGFET gate and a second IGFET gate may receive a differential input voltage at first and second input terminals, respectively. A first IGFET drain may be connected to a third current source. A second IGFET drain may be connected to a fourth current source. A second OTA may include a third IGFET and a fourth IGFET. A third IGFET source and a fourth IGFET source may be commonly connected to a second current source. A third IGFET gate and a third IGFET drain may be commonly connected to a first IGFET drain and a first output terminal. A fourth IGFET gate and a fourth IGFET drain may be commonly connected to a second IGFET drain and a second output terminal. A current value of third and fourth current sources may be essentially $I_0$, the current value of a first current source may be essentially $I_0(1+x)$, and a current value of a second current source may be essentially $I_0(1-x)$, where $I_0$ may be essentially a constant current value and x may be a variable in the range −1<x<1.

According to another aspect of the embodiments, a first OTA may include a fifth IGFET and a sixth IGFET. The fifth and sixth IGFETs may have source/drain paths commonly connected between a first IGFET source and a second IGFET source. A fifth IGFET gate may be connected to a first input terminal and a sixth IGFET gate may be connected to a second input terminal.

According to another aspect of the embodiments, a first OTA may include a fifth IGFET having a source/drain path connected between a first IGFET source and a second IGFET source. A fifth IGFET gate may be connected to receive a control potential.

According to another aspect of the embodiments, a current value of third and fourth current sources may be essentially $I_0/2+\beta V_{IN}^2/4$, the current value of the first current source may be essentially $I_0+\beta V_{IN}^2/2$, where $I_0$ may be essentially a constant current, 0 may be a transconductance parameter of an IGFET, and $V_{IN}$ may be the differential input voltage.

According to another aspect of the embodiments, a variable gain amplifier circuit may include a first OTA and a second OTA. A first OTA may include first and second bipolar transistors. A first transistor emitter and a second transistor emitter may be commonly connected to a first current source. A first transistor base and a second transistor base may receive a differential input voltage at first and second input terminals, respectively. A first transistor collector may be connected to a third current source. A second transistor collector may be connected to a fourth current source. A second OTA may include a third bipolar transistor and a fourth bipolar transistor. A third transistor emitter and a fourth transistor emitter may be commonly connected to a second current source. A third transistor base and a third transistor collector may be commonly connected to a first transistor collector and a first output terminal. A fourth transistor base and a fourth transistor collector may be commonly connected to a second transistor base and a second output terminal. A current value of third and fourth current sources may be essentially $I_0$, the current value of a first current source may be essentially $I_0(1+x)$, and a current value of a second current source may be essentially $I_0(1-x)$, where $I_0$ may be essentially a constant current value and x may be a variable in the range −1<x<1.

According to another aspect of the embodiments, first and second bipolar transistors may have a first emitter ratio different from 1. Third and fourth bipolar transistors may have a second emitter ratio different from 1.

According to another aspect of the embodiments, a first OTA may include a fifth bipolar transistor and a sixth bipolar transistor. A fifth collector may be connected to a first collector. A fifth base may receive a common voltage at a third input terminal. A fifth emitter may be connected to a first emitter. A sixth collector may be connected to a second collector. A sixth base may receive a common voltage at a third input terminal. A sixth emitter may be connected to a second emitter. The first bipolar transistor and fifth bipolar transistor may have a first emitter ratio different from 1. The sixth bipolar transistor and second bipolar transistor may have a second emitter ratio different from 1.

According to another aspect of the embodiments, a current value of third and fourth current sources may be essentially $I_0$, a current value of the first current source may be essentially $I_0\{1+\tan h(x/a)\}$, and a current value of the second current source may be essentially $I_0\{1-\tan h(x/a)\}$, where 10 may be essentially a constant current value, tan h may be a hyperbolic tangent function, a may be a constant, and x may be a variable in the range −1<x<1.

According to another aspect of the embodiments, a variable gain amplifier circuit may include a fifth bipolar transistor and a sixth bipolar transistor. A fifth emitter and a sixth emitter may be commonly connected to a fifth current source having a current value of essentially $2I_0$. A control voltage may be received between a fifth and sixth base. The fifth bipolar transistor may provide a current value of a first current source at a fifth collector and the sixth bipolar transistor may provide a current value of a second current source at a sixth collector.

BRIEF DESCRIPTION OF THE DRAWINGS

FIG. 13 is table calculation values of the driving current when the voltage gain is varied at 0.5 dB step from −6 dB to 6 dB around a median of 0 dB.

DETAILED DESCRIPTION OF THE EMBODIMENTS

The principle operation of the present invention will first be described. In the invention, the transconductance $g_m$ of an OTA (operational transconductance amplifier) may be made almost proportional to the driving current or the square root of the driving current. Accordingly, the driving currents of two OTAs may include variable functions such as 1+x and 1−x, so that the voltage gain of a VGA including two OTAs may be set at $$G_V = \sqrt{\frac{1+x}{1-x}}$$

or $$G_V = \frac{1+x}{1-x}.$$

Herein, the approximation may be made such as $$e^{\frac{2x}{n}} \approx \left(\frac{1+x}{1-x}\right)^{\frac{1}{n}}.$$

This function may have an exponential characteristic for x and may approximate the exponential characteristic.

Alternatively, the exponential characteristic can be approximated based on the identity $$e^{\frac{x}{n}} = \left\{\frac{1+\tanh\left(\frac{x}{2}\right)}{1-\tanh\left(\frac{x}{2}\right)}\right\}^{\frac{1}{n}}$$

and the driving currents of the two OTAs may be variable such as 1+tan h(x/a) and 1−tan h(x/a), where a is a constant and whereby the voltage gain of a VGA including two OTAs may be set at $$G_V = \sqrt{\frac{1+\tanh\left(\frac{x}{a}\right)}{1-\tanh\left(\frac{x}{a}\right)}}$$

or $$G_V = \frac{1+\tanh\left(\frac{x}{a}\right)}{1-\tanh\left(\frac{x}{a}\right)}.$$

In this case, the identity may be rewritten to $$e^{\frac{2x}{an}} = \left\{\frac{1+\tanh\left(\frac{x}{a}\right)}{1-\tanh\left(\frac{x}{a}\right)}\right\}^{\frac{1}{n}}$$

and still indicate the exponential characteristic.

In the invention, the voltage gain of a VGA may depend on the ratio of drive currents for two OTAs included in the VGA. Even though the driving current of an OTA may have a temperature characteristic, the temperature characteristic may not appear in the voltage gain characteristic if the current ratio remains essentially constant.

Also, in the invention, two OTAs included in a VGA may be realized with a simple differential pair. In this way, the power source voltage may be reduced.

Various embodiments of the present invention will now be described in detail with reference to a number of drawings.

Figure 1:
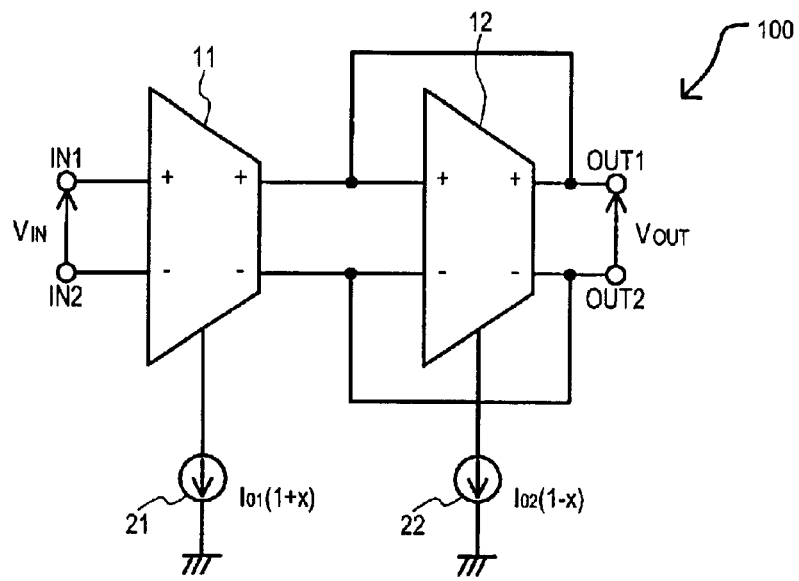
FIG. 1 is a circuit schematic diagram of a voltage gain amplifier circuit (VGA) according to an embodiment.

Referring now to FIG. 1, a circuit schematic diagram of a voltage gain amplifier circuit (VGA) according to an embodiment is set forth and given the general reference character 100.

VGA 100 may include a first operational transconductance amplifier (OTA) 11, a second OTA 12, and current sources (21 and 22).

Current source 21 may be connected between a ground potential and first OTA 11. Current source 22 may be connected between a ground potential and second OTA 21. First OTA 11 may receive a differential input voltage $V_{IN}$ and may provide an output. Second OTA 12 may receive the output of first OTA 11 and may provide a differential output voltage $V_{OUT}$.

First OTA 11 may output or input an electric current almost proportional to differential input voltage $V_{IN}$. Second OTA 12 may accept an output current (source current) or an input current (sink current) of first OTA 11 and may convert the current to a voltage with an input terminal and an output terminal connected so that the drive currents of OTAs (11 and 12) may be made variable to change the output voltage level. Namely, first OTA 11 may have two input terminals (IN1 and IN2) for accepting differential input voltage $V_{IN}$. Second OTA 12 may have first and second input terminals for accepting a current from output terminals of first OTA 11 and first and second output terminals (OUT1 and OUT2) for outputting a differential output voltage $V_{OUT}$. The first input terminal and first output terminal OUT1 of second OTA 11 may be connected and the second input terminal may be connected with the second output terminal OUT2. First and second OTAs (11 and 12) may have small-signal transconductances ($g_{m1}$ and $g_{m2}$), respectively, proportional to the square root (√) of the drive currents or the respective OTA (11 and 12). The driving current of first OTA 11 may be $I_{O1}(1+x)$ and the driving current of the second OTA 12 may be $I_{O2}(1-x)$, ($I_{O1}$ and $I_{O2}$ may be preset constant current values and x may be a variable in the range $-1<x<1$).

Figure 2:
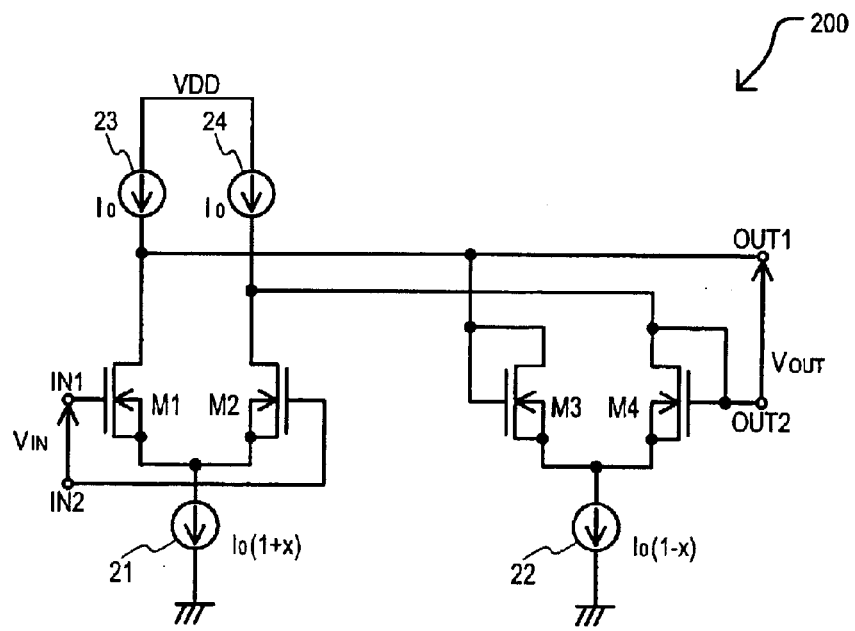
FIG. 2 is a circuit schematic diagram of a VGA according to an embodiment.

For simplicity of explanation, supposing driving current $I_{O1}=I_{O2}=I_0$ and OTAs (11 and 12) included in VGA 100 are realized by a differential pair, a circuit configuration as shown in FIG. 2 may result.

Referring now to FIG. 2, a circuit schematic diagram of a VGA according to an embodiment is set forth and given the general reference character 200.

VGA 200 may receive a differential input voltage $V_{IN}$ at input terminals (IN1 and IN2) and may provide a differential output voltage $V_{OUT}$ at output terminals (OUT1 and OUT2).

VGA 200 may include insulated gate field effect transistors (IGFETs) (M1 to M4) and current sources (21 to 24). IGFETs (M1 to M4) may be n-type IGFETs and more particularly may be n-channel MOS (metal-oxide-semiconductor) transistors, as just one example. Current source 21 may be connected between a ground potential and commonly connected sources of n-type IGFETs (M1 and M2). N-type IGFET M1 may have a drain connected to output terminal OUT1 and a gate connected to input terminal IN1. N-type IGFET M2 may have a drain connected to output terminal OUT2 and a gate connected to input terminal IN2. Current source 23 may be connected between a power source VDD and output terminal OUT1. Current source 24 may be connected between a power source VDD and output terminal OUT2. Current source 22 may be connected between a ground potential and commonly connected sources of n-type IGFETs (M3 and M4). N-type IGFET M3 may have a gate and drain commonly connected to output terminal OUT1. N-type IGFET M4 may have a gate and drain commonly connected to output terminal OUT2.

Current sources (23 and 24) may be constant current sources and may each provide a drive current $I_0$. Current source 21 may provide a current that may be variably controlled to have a current value ($I_0(1+x)$). Current source 22 may provide a current that may be variably controlled to have a current value ($I_0(1-x)$). For current values ($I_0(1+x)$ and $I_0(1-x)$) of current sources (21 and 22), x may be such that $-1<x<1$, where x may be variably set by a gain control signal for controlling the voltage gain of VGA 200.

N-type IGFETs (M1 and M2) and current sources (23 and 24) of VGA 200 may essentially correspond to OTA 11 of VGA 100 in FIG. 1. N-type IGFETs (M3 and M4) of VGA 200 may essentially correspond to OTA 12 of VGA 100 in FIG. 1.

Assuming that the driving current of a first OTA composed of n-type IGFETs (M1 and M2) is $I_0(1+x)$, the driving current of a second OTA composed of n-type IGFETs (M3 and M4) is $I_0(1-x)$, and n-type IGFETs (M1, M2, M3, and M4) have drain currents of ($I_{D1}$, $I_{D2}$, $I_{D3}$, and $I_{D4}$), respectively, $$I_{D1}=\beta(V_{GS1}-V_{TH})^2$$

$$I_{D2}=\beta(V_{GS2}-V_{TH})^2$$

(where $\beta$ is the transconductance parameter, $V_{GS1}$ and $V_{GS2}$ are the gate to source voltage of n-type IGFETs (M1 and M2), respectively, and $V_{TH}$ is the threshold voltage). Drain currents ($I_{D1}$ and $I_{D2}$) may be represented by $V_{GS1}$ and $V_{GS2}$ and derived from the expressions, $$V_{GS1}-V_{GS2}=V_{IN}$$

$$I_{D1}+I_{D2}=I_0(1+x)$$

In this way, drain currents ($I_{D1}$ and $I_{D2}$) may be represented by expressions (14) and (15), below. Similarly, drain currents ($I_{D3}$ and $I_{D4}$) may be derived from the expressions, $$I_{D3}=\beta(V_{GS3}-V_{TH})^2$$

$$I_{D4}=\beta(V_{GS4}-V_{TH})^2$$

$$V_{GS3}-V_{GS4}=V_{OUT}$$

$$I_{D3}+I_{D4}=I_0(1-x)$$

(where $V_{GS3}$ and $V_{GS4}$ are the gate to source voltages of n-type IGFETs (M3 and M4), respectively). In this way, drain currents ($I_{D3}$ and $I_{D4}$) may be represented by expressions (16) and (17), below.

$$I_{D1} = \frac{I_0(1+x)}{2} + \frac{\beta V_{IN}\sqrt{\frac{2I_0(1+x)}{\beta} - V_{IN}^2}}{2} \quad (14)$$

$$I_{D2} = \frac{I_0(1+x)}{2} - \frac{\beta V_{IN}\sqrt{\frac{2I_0(1+x)}{\beta} - V_{IN}^2}}{2} \quad (15)$$

$$I_{D3} = \frac{I_0(1-x)}{2} + \frac{\beta V_{OUT}\sqrt{\frac{2I_0(1-x)}{\beta} - V_{OUT}^2}}{2} \quad (16)$$

$$I_{D4} = \frac{I_0(1-x)}{2} + \frac{\beta V_{OUT}\sqrt{\frac{2I_0(1-x)}{\beta} - V_{OUT}^2}}{2} \quad (17)$$

Also, $$I_{D1}+I_{D3}=I_0 \quad (18)$$

$$I_{D2}+I_{D4}=I_0. \quad (19)$$

Solving expressions (14) to expression (19), $$V_{IN}\sqrt{\frac{2I_0(1+x)}{\beta} - V_{IN}^2} = -V_{OUT}\sqrt{\frac{2I_0(1-x)}{\beta} - V_{OUT}^2} \quad (20)$$

results.

Because at small signal, $$|V_{IN}| << \sqrt{\frac{2I_0(1+x)}{\beta}}, \; |V_{OUT}| << \sqrt{\frac{2I_0(1-x)}{\beta}}$$

the voltage gain $G_V$ of VGA 200 can be simplified to $$G_V = \left|\frac{V_{OUT}}{V_{IN}}\right| \approx \sqrt{\frac{2I_0(1+x)}{\beta}} \Big/ \sqrt{\frac{2I_0(1-x)}{\beta}} = \sqrt{\frac{1+x}{1-x}}. \quad (21)$$

Figure 3:
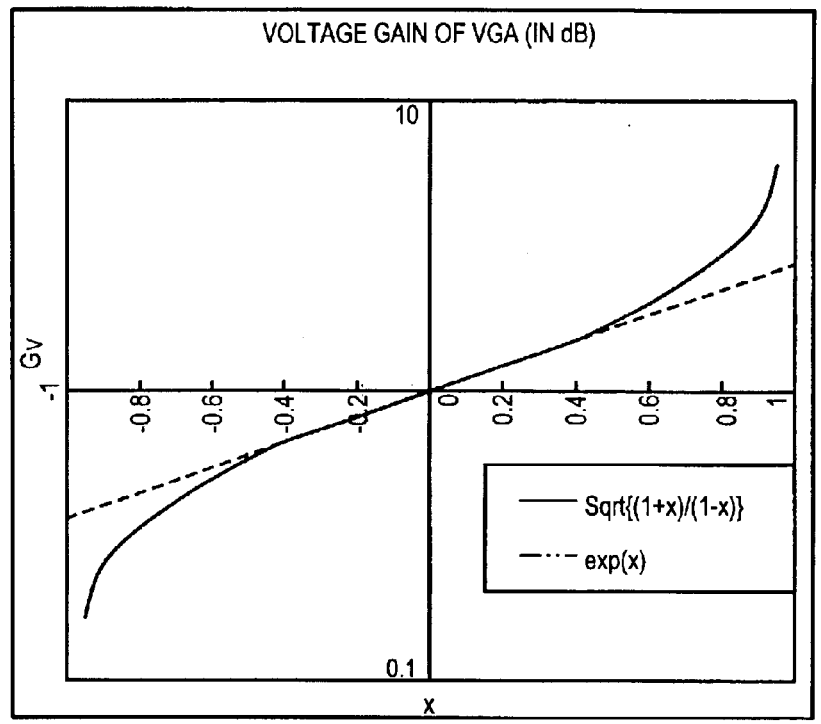
FIG. 3 is a graph representing an approximate expression for use with a VGA according to an embodiment.

Referring now to FIG. 3, a graph representing the voltage gain and a variation x in the drive current as represented by expression (21) is set forth according to an embodiment. From FIG. 3, it can be seen that an approximation error of the exponential characteristic (exp(x)) may be smaller than that given by the approximate expressions (1) and (2) (better given as expression (3)).

Additionally, from the expression $$e^{2x} \approx \frac{1+x}{1-x}$$

as represented by expression (3), $$e^x \approx \frac{1+x}{1-x}$$

may be easily derived.

In this connection, the small-signal transconductance $g_{m1}$ (=$d\Delta I/dV_{IN}$=$d(I_{D1}-I_{D2})/dV_{IN}$) for a first OTA including n-type IGFETs (M1 and M2) is equal to $$g_{m1}=\sqrt{2\beta I_0(1+x)} \qquad (22)$$

from expressions (14) and (15).

Also, the small-signal transconductance $g_{m2}$ for a second OTA, including n-type IGFETs (M3 and M4) is equal to $$g_{m2}=\sqrt{2\beta I_0(1-x)}. \qquad (23)$$

The transconductances ($g_{m1}$ and $g_{m2}$) of first and second OTAs may be proportional to the square root of the drive currents of the first and second OTAs.

Accordingly, the voltage gain $G_V$ of VGA 200 may be obtained such as $$G_V = \left|\frac{V_{OUT}}{V_{IN}}\right| = \frac{g_{m1}}{g_{m2}} = \frac{\sqrt{2\beta I_0(1+x)}}{\sqrt{2\beta I_0(1-x)}} = \sqrt{\frac{1+x}{1-x}}. \qquad (24)$$

It is noted here that because the transconductance parameter β has a negative temperature characteristic in expressions (22) and (23), the small-signal transconductance $g_m$ of an OTA may have a negative temperature characteristic.

If drive currents ($I_0(1+x)$ and $I_0(1-x)$) have a temperature characteristic, the small-signal transconductance $g_m$ of the OTA may also have the temperature characteristic.

On the other hand, it can be seen from expression (24) that the voltage gain $G_V$ of VGA 200 may not be affected by a temperature characteristic of β. If the current ration is constant, even though drive currents ($I_0(1+x)$ and $I_0(1-x)$) have a temperature characteristic, the voltage gain $G_V$ of VGA 200 may not be affected by the temperature characteristic of a drive current.

Moreover, from a VGA 200 shown in FIG. 2, by using a differential pair, the power supply voltage may be decreased.

In a VGA 200, which includes two simple OTAs using a differential pair, the logarithmic characteristic may be approximated by making the drive currents ($I_0(1+x)$ and $I_0(1-x)$) for driving the two OTAs variable when the transconductance $g_m$ of an OTA is proportional to the square root of the drive current of the OTA.

Figure 4:
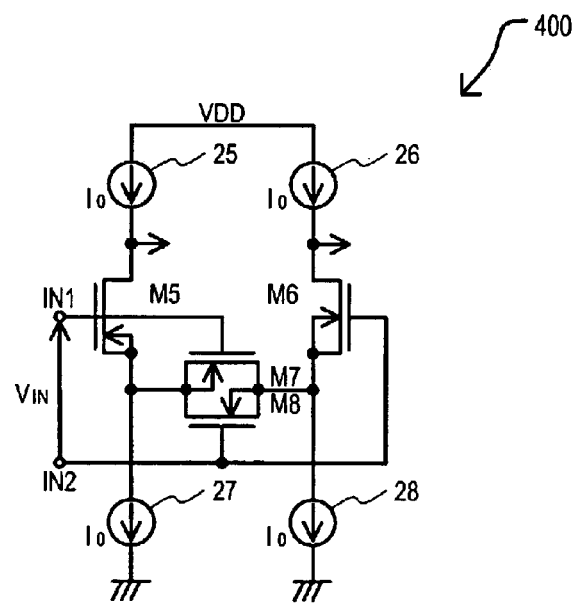
FIG. 4 is a circuit schematic diagram of a an OTA in which the transconductance is essentially proportional to the square root of the driving current for use in a VGA according to an embodiment.
Figure 5:
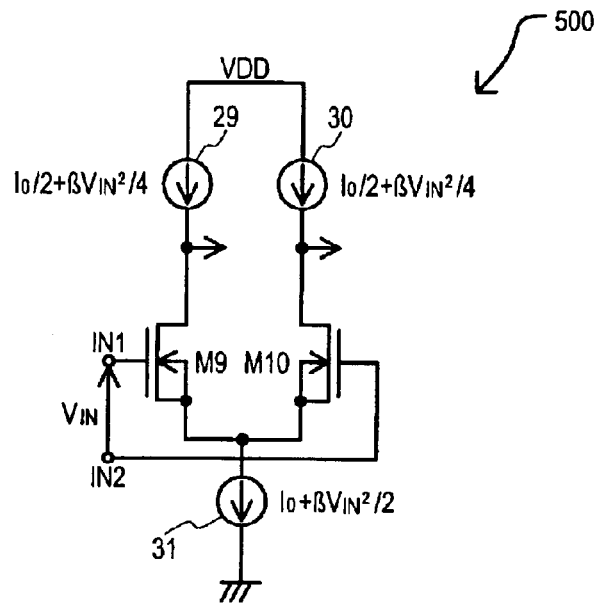
FIG. 5 is a circuit schematic diagram of an OTA for use in a VGA according to an embodiment.

According to the embodiments, an arbitrary circuit configuration may be taken for an OTA in which the transconductance is essentially proportional to the square root of the driving current. In FIG. 4, a circuit schematic diagram of a VGA including an OTA in which the transconductance is essentially proportional to the square root of the driving current according to an embodiment is set forth and given the general reference character 400. In FIG. 5, a circuit schematic diagram of a VGA including an OTA in which the drive current for a differential pair is increased with the input signal to the second power according to an embodiment is set forth and given the general reference character 500.

Referring now to FIG. 4, VGA 400 may include n-type IGFETs (M5 to M8) and current sources (25 to 28). Current sources (25 to 28) may be constant current sources having a driving current $I_0$. Current source 25 may be connected between a power source VDD and a drain of n-type IGFET M5. Current source 26 may be connected between a power source VDD and a drain of n-type IGFET M6. Current source 27 may be connected between a ground potential and a source of n-type IGFET M5 and a common source/drain connection of n-type IGFETs (M7 and M8). Current source 28 may be connected between a ground potential and a source of n-type IGFET M6 and a common source/drain connection of n-type IGFETs (M7 and M8). N-type IGFETs (M5 and M7) may have gates connected to input terminal IN1. N-type IGFETs (M6 and M8) may have gates connected to input terminal IN2.

Referring now to FIG. 5, VGA 500 may include n-type IGFETs (M9 and M10) and current sources (29 to 31). Current source 29 may be connected between a power source VDD and a drain of n-type IGFET M9. Current source 30 may be connected between a power source VDD and a drain of n-type IGFET M10. Current sources (29 and 30) may have a drive current value ($I_0/2+\beta V_{IN}^2/4$). Current source 31 may be connected between a ground potential and a common source connection of n-type IGFETs (M9 and M10). Current source 31 may have a drive current value ($I_0+\beta V_{IN}^2/2$). N-type IGFET M9 may have a gate connected to input terminal IN1. N-type IGFET M10 may have a gate connected to input terminal IN2.

Figure 6:
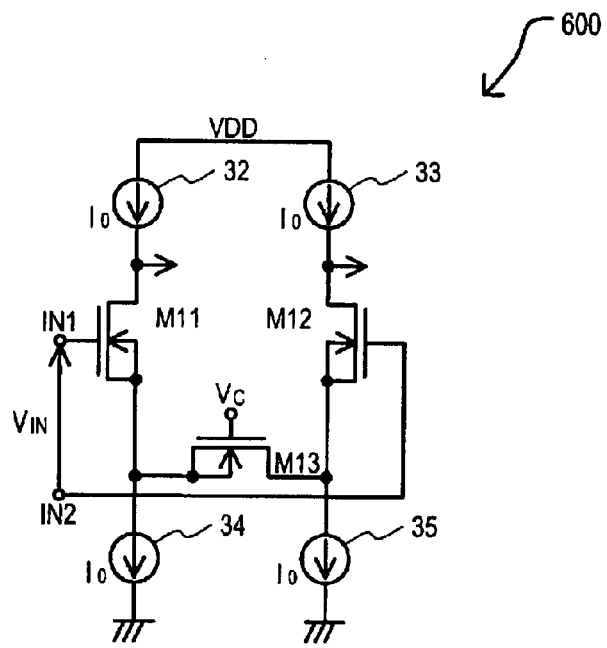
FIG. 6 is a circuit schematic diagram of an OTA in which the transconductance is essentially proportional to the square root of the drive current for use in a VGA according to an embodiment.

Referring now to FIG. 6, a circuit schematic diagram of a VGA including an OTA in which the transconductance is essentially proportional to the square root of the driving current according to an embodiment is set forth and given the general reference character 600.

VGA 600 may include n-type IGFETs (M11 to M13) and current sources (32 to 35). Current sources (32 to 35) may be constant current sources having a driving current $I_0$. Current source 32 may be connected between a power source VDD and a drain of n-type IGFET M11. Current source 33 may be connected between a power source VDD and a drain of n-type IGFET M12. Current source 34 may be connected between a ground potential and a common connection between a source of n-type IGFET M11 and a source/drain of n-type IGFET M13. Current source 35 may be connected between a ground potential and a common connection between a source of n-type IGFET M12 and a source/drain of n-type IGFET M13. N-type IGFET M11 may have a gate connected to input terminal IN1. N-type IGFET M12 may have a gate connected to input terminal IN2. N-type IGFET M13 may have a gate connected to a resistance control voltage $V_C$. N-type IGFET M13 may provide a variable source resistance. In this way, the transconductance of an OTA may be essentially proportional to the square root of the drive current by regarding n-type IGFET M13 as a variable source resistance. The source resistance value may be tuned with a resistance control voltage $V_C$ provided to the gate of n-type IGFET M13.

An embodiment in which an OTA includes bipolar transistors will be described below. The relation between a base to emitter voltage $V_{BE}$ and a collector current $I_C$ of a bipolar transistor is represented such as $$I_C = I_S\left\{e^{\frac{V_{BE}}{V_T}} - 1\right\}. \qquad (25)$$

Herein, $$V_T = \frac{kT}{q}$$

is the thermal voltage, k is Boltzmann's constant, T is absolute temperature, q is a unit electron charge, and $I_s$ is the saturation current of the bipolar transistor.

In the operation area, $$e^{\frac{V_{BE}}{V_T}} \gg 1 \tag{26}$$

$$I_C = I_s e^{\frac{V_{BE}}{V_T}}.$$

Figure 7:
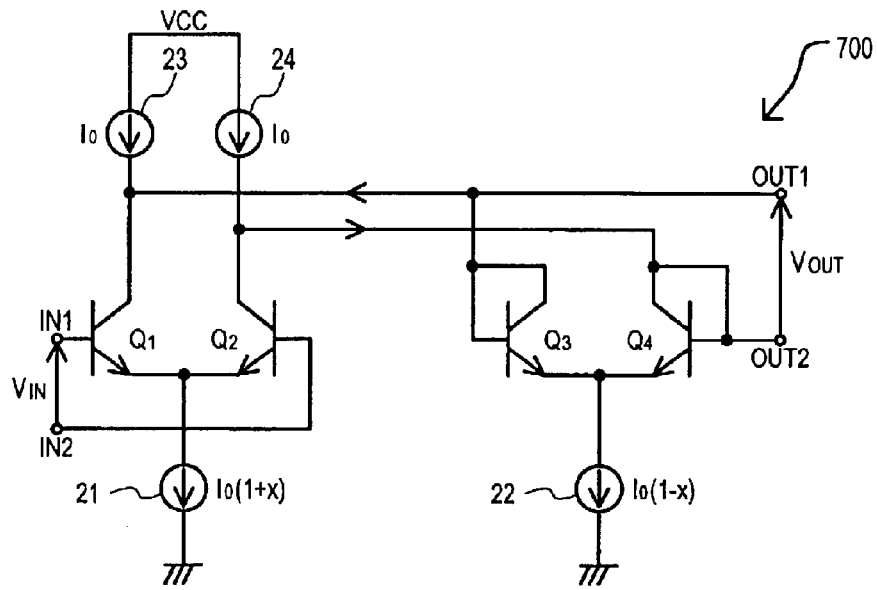
FIG. 7 is a circuit schematic diagram of a variable gain amplifier circuit (VGA) according to an embodiment.

Referring now to FIG. 7, a circuit schematic diagram of a VGA according to an embodiment is set forth and given the general reference character 700. FIG. 7 may illustrate an example in which VGA 100 of FIG. 1 includes bipolar transistors. VGA 700 may receive a differential input voltage $V_{IN}$ at input terminals (IN1 and IN2) and may provide a differential output voltage $V_{OUT}$ at output terminals (OUT1 and OUT2).

VGA 700 may include current sources (21 to 24) and bipolar transistors (Q1 to Q4). Current source 21 may be connected between a ground potential and commonly connected emitters of bipolar transistors (Q1 and Q2). Bipolar transistor Q1 may have a collector connected to output terminal OUT1 and a base connected to input terminal IN1. Bipolar transistor Q2 may have a collector connected to output terminal OUT2 and a base connected to input terminal IN2. Current source 23 may be connected between a power source VCC and output terminal OUT1. Current source 24 may be connected between a power source VCC and output terminal OUT2. Current source 22 may be connected between a ground potential and commonly connected emitters of bipolar transistors (Q3 and Q4). Bipolar transistor Q3 may have a collector and base commonly connected to output terminal OUT1. Bipolar transistor Q4 may have a collector and base commonly connected to output terminal OUT2.

Current sources (23 and 24) may be constant current sources and may each provide a drive current $I_0$. Current source 21 may provide a current that may be variably controlled to have a current value ($I_0(1+x)$). Current source 22 may provide a current that may be variably controlled to have a current value ($I_0(1-x)$). For current values ($I_0(1+x)$ and $I_0(1-x)$) of current sources (21 and 22), x may be such that $-1<x<1$, where x may be variably set by a gain control signal for controlling the voltage gain of VGA 700.

Bipolar transistors (Q1 and Q2) and current sources (23 and 24) of VGA 700 may essentially correspond to OTA 11 of VGA 100 in FIG. 1. Bipolar transistors (Q3 and Q4) of VGA 700 may essentially correspond to OTA 12 of VGA 100 in FIG. 1.

Assuming that the base-emitter voltages of bipolar transistors (Q1 to Q4) are ($V_{BE1}$ to $V_{BE4}$), respectively, the collector currents ($I_{C1}$ to $I_{C4}$) of bipolar transistors (Q1 to Q4), respectively may be represented such as, $$I_{C1} = I_s e^{\left(\frac{V_{BE1}}{V_T}\right)}$$

$$I_{C2} = I_s e^{\left(\frac{V_{BE2}}{V_T}\right)}$$

-continued $$V_{BE1} - V_{BE1} = V_{IN}$$

$$I_{C1} + I_{C2} = \alpha_F \cdot I_0(1+x)$$

$$I_{C3} = I_s e^{\left(\frac{V_{BE3}}{V_T}\right)}$$

$$I_{C4} = I_s e^{\left(\frac{V_{BE4}}{V_T}\right)}$$

$$I_{C3} + I_{C4} = \alpha_F \cdot I_0(1-x)$$

$$I_{C1} = \frac{\alpha_F I_0(1+x)}{2} + \frac{\alpha_F I_0(1+x)\tanh\left(\frac{V_{IN}}{2V_T}\right)}{2} \tag{27}$$

$$I_{C2} = \frac{\alpha_F I_0(1+x)}{2} - \frac{\alpha_F I_0(1+x)\tanh\left(\frac{V_{IN}}{2V_T}\right)}{2} \tag{28}$$

$$I_{C3} = \frac{\alpha_F I_0(1-x)}{2} + \frac{\alpha_F I_0(1-x)\tanh\left(\frac{V_{OUT}}{2V_T}\right)}{2} \tag{29}$$

$$I_{C4} = \frac{\alpha_F I_0(1-x)}{2} + \frac{\alpha_F I_0(1-x)\tanh\left(\frac{V_{OUT}}{2V_T}\right)}{2}. \tag{30}$$

$\alpha_F$ is the direct current amplification factor of a bipolar transistor and typically is almost equal to 1. Herein, it is assumed that $$\alpha_F = 1$$

$$I_{C1} + I_{C3} = I_0 \tag{31}$$

$$I_{C2} + C_4 = I_0 \tag{32}$$

Solving expression (32) from expression (27), $$(1+x)\tanh\left(\frac{V_{IN}}{V_T}\right) = (1-x)\tanh\left(\frac{V_{OUT}}{V_T}\right) \tag{33}$$

results.

At small signal, $$|V_{IN}| \ll V_T, |V_{OUT}| \ll V_T$$

whereby $$\tanh\left(\frac{x}{a}\right) \approx \frac{x}{a}$$

is obtained as an approximation, so that $$G_V = \left|\frac{V_{OUT}}{V_{IN}}\right| = \frac{1+x}{1-x} \tag{34}$$

can be obtained.

Figure 16:
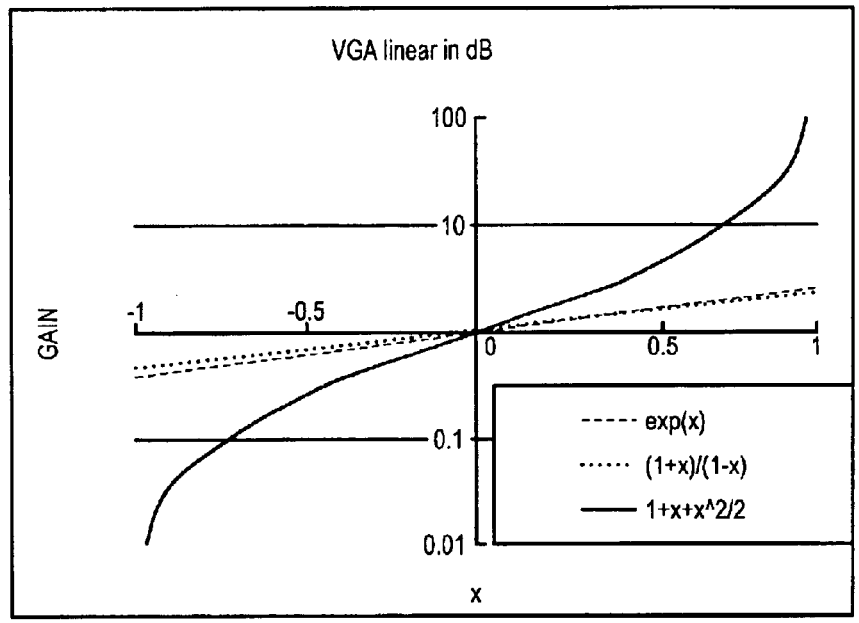
FIG. 16 is a graph illustrating the relationship between approximate expressions for use with a conventional variable gain amplifier circuit.
Figure 17:
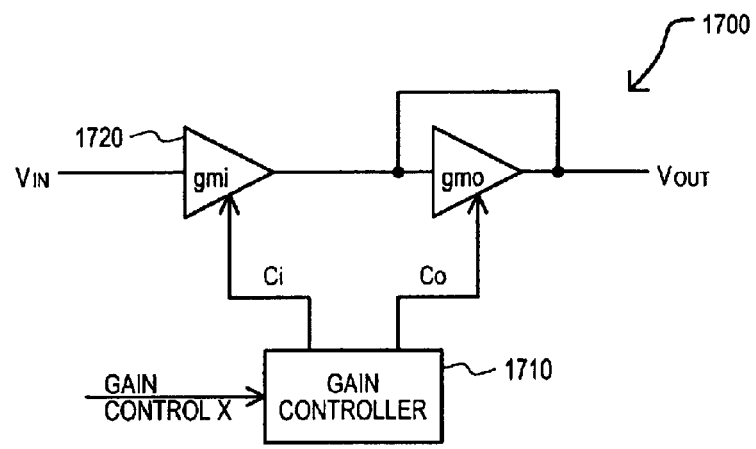
FIG. 17 is a circuit schematic diagram of a conventional variable gain amplifier circuit (VGA).
Figure 18:
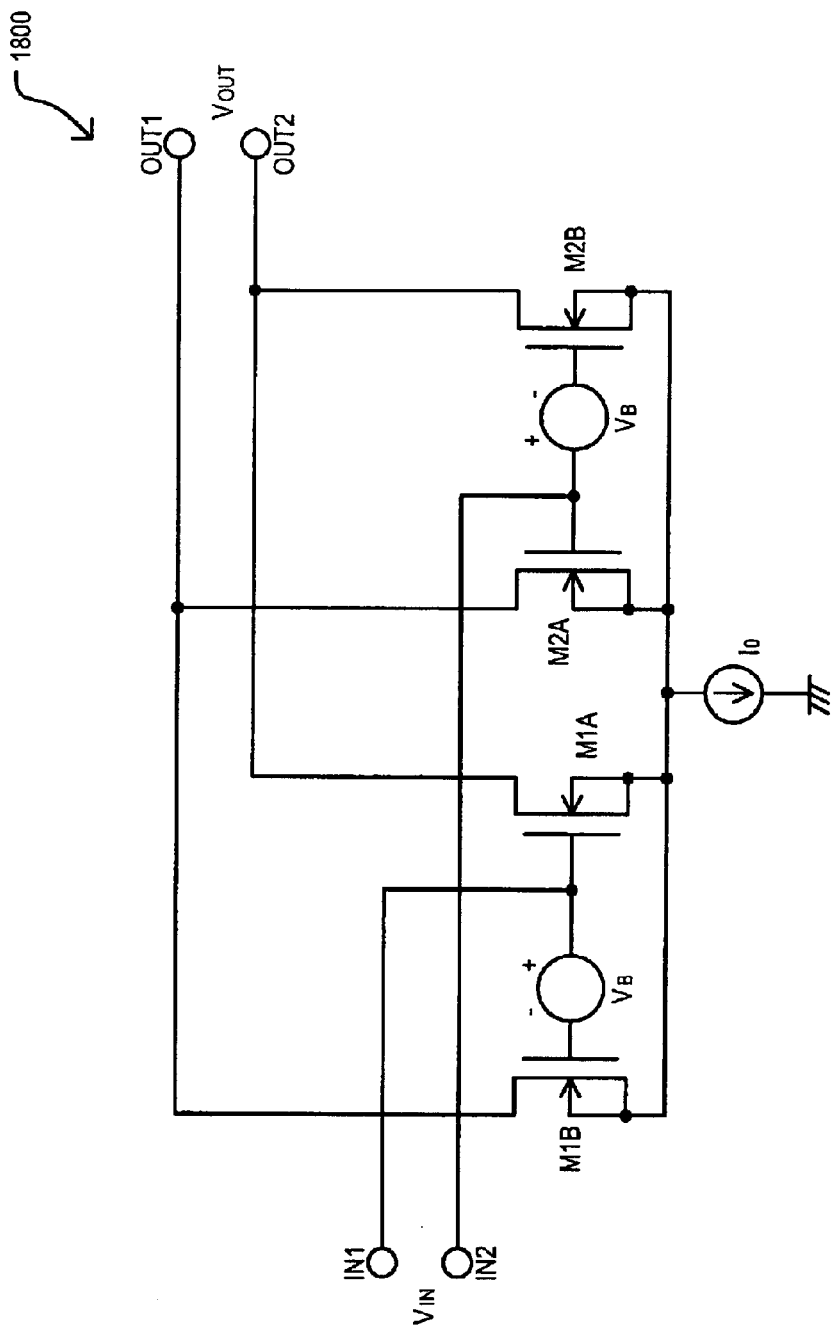
FIG. 18 is a circuit schematic diagram of a conventional multiplier.
Figure 19:
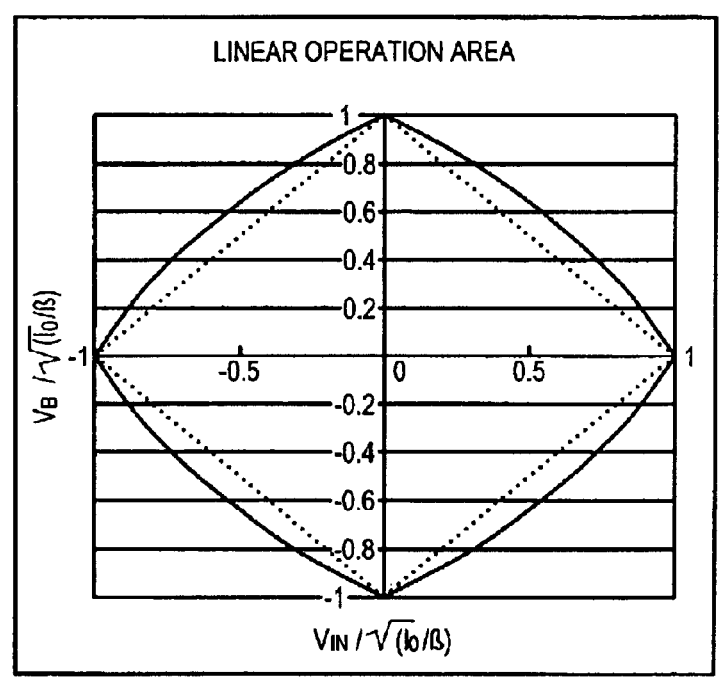
FIG. 19 is a graph showing a linear input voltage range of a conventional multiplier for use with a conventional variable gain amplifier circuit.
Figure 20:
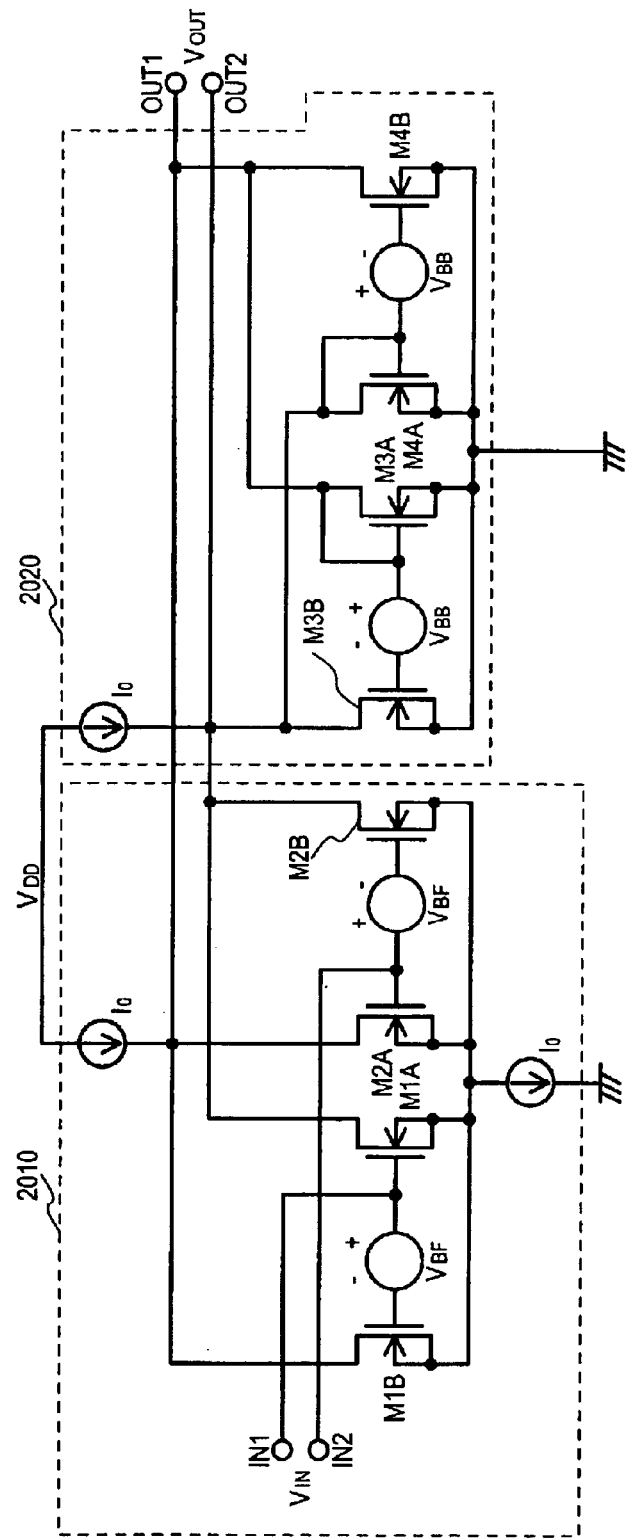
FIG. 20 is a circuit schematic diagram of a conventional variable gain amplifier circuit (VGA).

This characteristic may be exactly the same as for the approximation using the conventional bilinear transformation as shown in FIG. 16.

In this connection, the small-signal transconductance $g_{m1}$ for a first OTA including bipolar transistors (Q1 and Q2) is $$g_{m1} = \frac{\alpha_F I_0 (1+x)}{2V_T}. \tag{35}$$

The small-signal transconductance $g_{m1}$ for a first OTA including bipolar transistors (Q3 and Q4) is $$g_{m2} = \frac{\alpha_F I_0 (1-x)}{2V_T}. \tag{36}$$

The transconductances ($g_{m1}$ and $g_{m2}$) of the first and second OTAs may be proportional to the drive currents of the first and second OTAs, respectively.

Accordingly, the voltage gain $G_V$ of the VGA 700 is obtained as $$G_V = \left| \frac{V_{OUT}}{V_{IN}} \right| = \frac{g_{m1}}{g_{m2}} = \frac{\alpha_F I_0 (1+x)}{\alpha_F I_0 (1-x)} = \frac{1+x}{1-x}. \tag{37}$$

It is noted here that because thermal voltage $V_T$ in the denominator of expressions (35) and (36) has a positive temperature characteristic, the small-signal transconductance may have a negative temperature characteristic. Also, if drive currents ($I_0(1+x)$ and $I_0(1-x)$) have a temperature characteristic, the small-signal transconductance may also have the temperature characteristic.

On the other hand, it can be seen from expression (37) that the voltage gain $G_V$ of VGA 700 may not be affected by the temperature characteristics of thermal voltage $V_T$, if its current ratio is constant. Furthermore, from a VGA 700 as illustrated in FIG. 7, by using a differential pair, the power voltage may be decreased.

In a VGA including two simple OTAs that are differential pairs, when the transconductance of the OTA is proportional to the driving current, the exponential characteristic may be approximated by making the driving current for the two OTAs variable.

Figure 8:
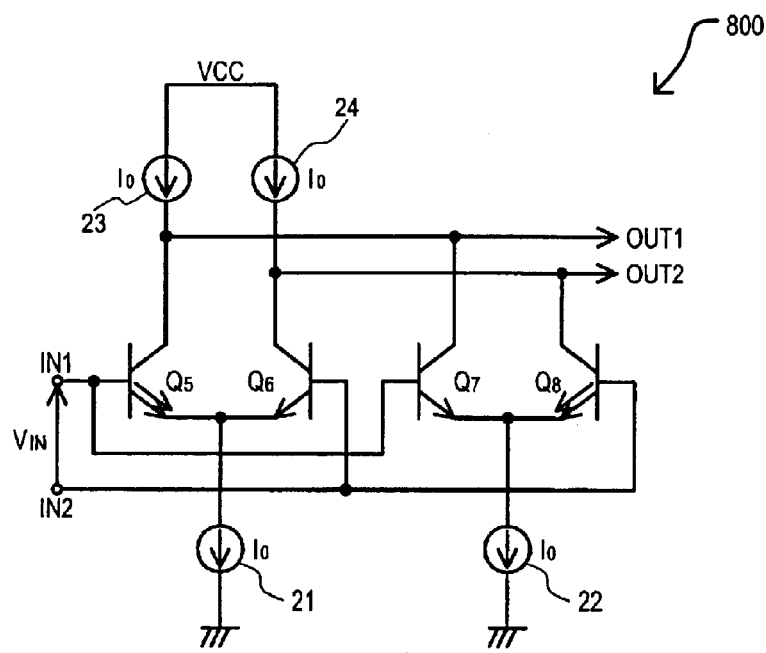
FIG. 8 is a VGA including a plurality of differential pairs using a multi tan h technique according to an embodiment.
Figure 9:
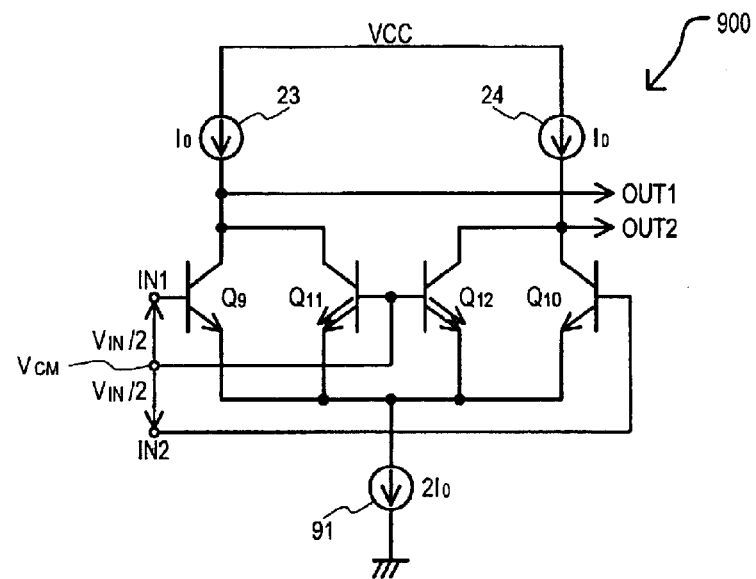
FIG. 9 is a VGA including multi-tail cells in which emitters of four bipolar transistors are commonly connected using an ultra-multi-tan h technique according to an embodiment.

According to the embodiments, in addition to the above configurations, an arbitrary circuit configuration may be taken for an OTA in which the transconductance is almost proportional to the driving current. For example, an OTA may include a plurality of differential pairs using a multi-tan h technique (called a multi-tan h tablet, with an emitter size ratio of bipolar transistor pair (Q6 to Q5 and Q7 to Q8) composing the differential pair is 1:2+√3), as shown in FIG. 8. Also, an OTA may include multi-tail cells in which emitters of four bipolar transistors are commonly connected using an ultra-multi-tan h technique as shown in FIG. 9. In the example of FIG. 9, one triple-tail cell is shown and the emitter size ratio of bipolar transistors (Q9 and Q10) to bipolar transistors (Q11 and Q12) may be 1:2.

Referring now to FIG. 8, a VGA including a plurality of differential pairs using a multi-tan h technique is set forth and given the general reference character 800. VGA 800 may include bipolar transistor pairs (Q5 and Q6), bipolar transistor pairs (Q7 and Q8), and current sources (21 to 24). Current source 21 may be connected between the ground potential and commonly connected emitters of bipolar transistors (Q5 and Q6). Bipolar transistor Q5 may have a collector connected to output terminal OUT1 and a base connected to input terminal IN1. Bipolar transistor Q6 may have a collector connected to output terminal OUT2 and a base connected to input terminal IN2. Current source 23 may be connected between a power source VCC and output terminal OUT1. Current source 24 may be connected between a power source VCC and output terminal OUT2. Current source 22 may be connected between the ground potential and commonly connected emitters of bipolar transistors (Q7 and Q8). Bipolar transistor Q7 may have a collector connected to output terminal OUT1. Bipolar transistor Q8 may have a collector connected to output terminal OUT2.

An emitter size ratio of bipolar transistor pair (Q6 to Q5) composing a differential pair may be essentially 1:2+√3. An emitter size ratio of bipolar transistor pair (Q7 to Q8) composing a differential pair may be essentially 1:2+√3.

Referring now to FIG. 9, a VGA including multi-tail cells in which emitters of four bipolar transistors are commonly connected using an ultra-multi-tan h technique is set forth and given the general reference character 900.

VGA 900 may include bipolar transistors (Q9 to Q12) and current sources (23, 24, and 91). Current source 91 may be connected between the ground potential and commonly connected emitters of bipolar transistors (Q9 to Q12). Bipolar transistor Q9 may have a collector connected to an output terminal OUT1 and a base connected to an input terminal IN1. Bipolar transistor Q10 may have a collector connected to an output terminal OUT2 and a base connected to an input terminal IN2. Bipolar transistor Q11 may have a collector connected to output terminal OUT1 and a base connected to an input terminal receiving a common voltage $V_{CM}$. Bipolar transistor Q12 may have a collector connected to output terminal OUT2 and a base connected to an input terminal receiving a common voltage $V_{CM}$. Current source 23 may be connected between a power source VCC and output terminal OUT1. Current source 24 may be connected between a power source VCC and output terminal OUT2.

An OTA in VGA 900 may include bipolar transistors (Q9 to Q12). A differential input voltage of $V_{IN}$ may be provided at input terminals (IN1 and IN2) by providing voltages ($V_{CM}+V_{IN}/2$ and $V_{CM}-V_{IN}/2$) at input terminals (IN1 and IN2), respectively. An emitter size ratio of bipolar transistors (Q9 and Q10 to Q11 and Q12) may be essentially 1:2.

As illustrated in FIG. 3, a voltage gain characteristic of a VGA is varied around $G_V=1$ (0 dB). However, in a case where a VGA is applied to a system such as radio equipment which may require a voltage gain as large as approximately 100 dB or more, the median may have a voltage gain of one or greater and may be preferably set as $G_V>1$ in the operational area of the VGA, for example. As a specific example, drive currents of two OTAs included in a VGA may be weighted.

If a driving current of a first OTA is multiplied by K to have K $I_0(1+x)$, and a driving current of a second OTA is $I_0(1+x)$, the voltage gain $G_V$ of a VGA formed including IGFETs, such as a MOSFET formed VGA (MOSVGA), is $$G_V = \left| \frac{V_{OUT}}{V_{IN}} \right| = \frac{g_{m1}}{g_{m2}} = \frac{\sqrt{2\beta K I_0 (1+x)}}{\sqrt{2\beta I_0 (1-x)}} = \sqrt{K} \sqrt{\frac{1+x}{1-x}} \tag{38}$$

and may be set so that the median may have a voltage gain

√K.

Or the voltage gain of Gv of a bipolar transistor formed VGA is $$G_V = \left| \frac{V_{OUT}}{V_{IN}} \right| = \frac{g_{m1}}{g_{m2}} = \frac{KI_0(1+x)}{I_0(1-x)} = K\frac{1+x}{1-x}. \quad (39)$$

Or if a transconductance parameter of each transistor for a differential-pair in a first OTA is multiplied by K, a small-signal transconductance of the first OTA may be $$g_{m1} = \sqrt{2K\beta I_0(1+x)}. \quad (40)$$

Hence, the voltage gain $G_v$ of a VGA formed including IGFETs, such as a MOSVGA, is $$G_V = \left| \frac{V_{OUT}}{V_{IN}} \right| = \frac{g_{m1}}{g_{m2}} = \frac{2\sqrt{2\beta K I_0(1+x)}}{\sqrt{2\beta I_0(1-x)}} = \sqrt{K}\sqrt{\frac{1+x}{1-x}} \quad (41)$$

and may be set so that the median may have a voltage gain $$\sqrt{K}.$$

Moreover, if a first OTA included in a VGA is a composite OTA in which two OTAs are connected in parallel, the transconductance $g_{m1}$ may be double. Thus, the voltage gain $G_v$ of a VGA formed including IGFETs, such as a MOSVGA, is $$G_V = \left| \frac{V_{OUT}}{V_{IN}} \right| = \frac{g_{m1}}{g_{m2}} = \frac{2\sqrt{2\beta I_0(1+x)}}{\sqrt{2\beta I_0(1-x)}} = 2\sqrt{\frac{1+x}{1-x}}. \quad (42)$$

In a case where a first OTA is a composite OTA in which two OTAs are connected in parallel, the voltage gain of Gv for a bipolar transistor formed VGA is $$G_V = \left| \frac{V_{OUT}}{V_{IN}} \right| = \frac{g_{m1}}{g_{m2}} = \frac{2I_0(1+x)}{I_0(1-x)} = 2\frac{1+x}{1-x}. \quad (43)$$

In this way, a VGA may be set so that a median may have a voltage gain of two (6 dB). For example, if a variable gain width of a VGA is ±6 dB, a gain may be variable from 0 dB to 12 dB with a median gain of 6 dB.

Similarly, for a VGA 100 as illustrated in FIG. 1, in a case where transconductances ($g_{m1}$ and $g_{m2}$) of first and second OTAs (11 and 12) are proportional to the square root of driving currents ($I_{o1}$ and $I_{o2}$), a voltage gain may be obtained from $G_V = g_{m1}/g_{m2}$ in the same manner as above, such as, $$G_V = \sqrt{\frac{I_{01}(1+x)}{I_{02}(1-x)}}. \quad (44)$$

In such a VGA, the gain of the median with x=0 may be $G_V = \sqrt{(I_{01}/I_{02})}$, which is the square root of the ratio of driving currents ($I_{o1}$ and $I_{o2}$). In the case of $I_{o1}=I_{o2}$, the voltage gain at x=0 may be $G_V=1$(0 dB). Also, when transconductances ($g_{m1}$ and $g_{m2}$) of first and second OTAs (11 and 12) are proportional to the driving currents ($I_{o1}$ and $I_{o2}$), a voltage gain may be obtained from $G_V=g_{m1}/g_{m2}$, such as $$G_V = \frac{I_{01}(1+x)}{I_{02}(1-x)}. \quad (45)$$

In such a VGA, the gain of the median with x=0 may be $G_V=(I_{01}/I_{02})$, which is the ratio of drive currents ($I_{o1}$ and $I_{o2}$). In the case of $I_{o1}=I_{o2}$, the voltage gain at x=0 may be $G_V=1$(0 dB).

The approximate function with the exponential characteristic for a VGA according to the embodiment as shown in FIG. 3 may be superior in the approximate characteristic to previously used methods. However as shown in FIG. 3, the approximation error may be rapidly increased as x approaches ±1. This approximation error may be due to the variation width of the driving current being equivalently increased as x approaches ±1.

Figure 11:
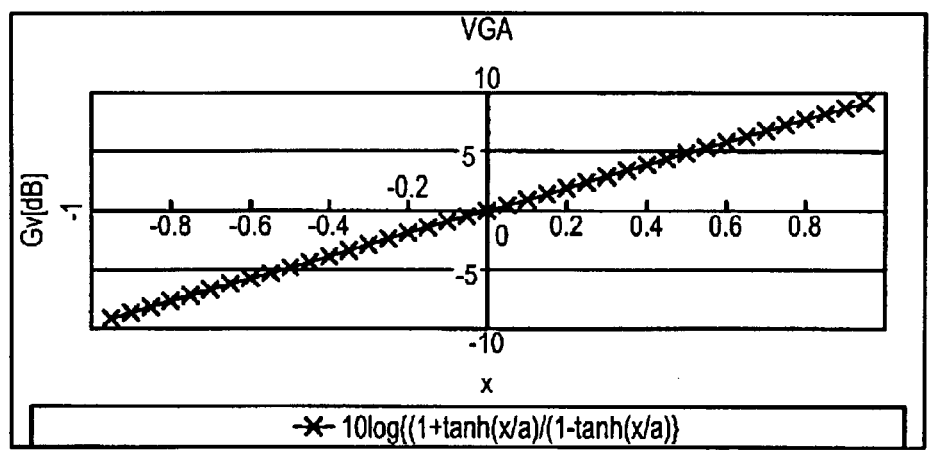
FIG. 11 is a graph showing a gain characteristic of a variable gain amplifier circuit based on an identity according to an embodiment.

In practice, it has been found that if x (-1<x=1) is replaced with tan h(x/8.858), the approximation error is about 0.000165 dB or less. FIG. 11 is a graph showing a gain characteristic of a variable gain amplifier circuit based on an identity according to an embodiment. As illustrated in FIG. 11, tan h(x/0.868588963765105) is $G_V=10x$ I the range -1<x<1, and represented by $e^x$.

Originally, because the identity $$e^x = \frac{1+\tanh\left(\frac{x}{2}\right)}{1-\tanh\left(\frac{x}{2}\right)} \quad (46)$$

holds, $$e^{\frac{x}{2}} = \sqrt{\frac{1+\tanh\left(\frac{x}{2}\right)}{1-\tanh\left(\frac{x}{2}\right)}} \quad (47)$$

may be obtained to produce the exponential characteristic.

Figure 10:
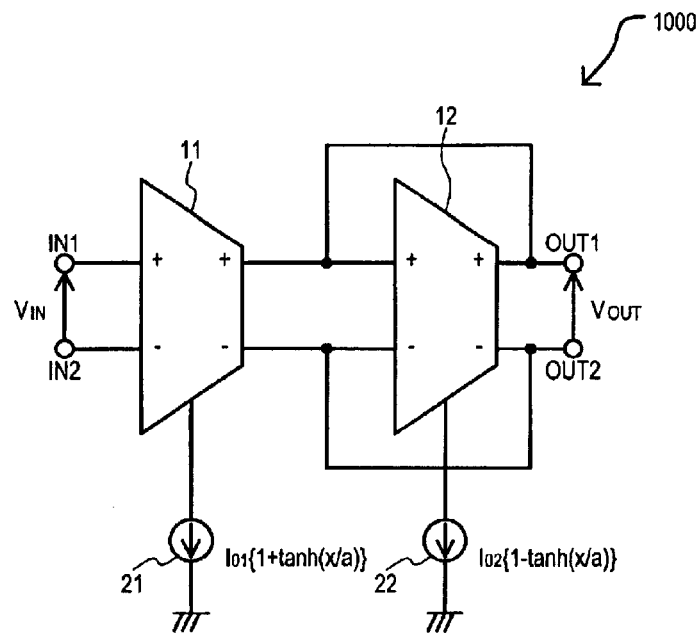
FIG. 10 is a schematic block diagram of a variable gain amplifier circuit such that a small-signal transconductance of each OTA is proportional to the square root of a driving current as mentioned above according to an embodiment.

Namely, in a VGA including two OTAs, when a small-signal transconductance of each OTA is proportional to the square root of a driving current, the driving current of first OTA 11 may be set to $I_{o1}\{1+\tan h(x/a)\}$ and the driving current of second OTA 12 may be set to $I_{o2}\{1-\tan h(x/a)\}$ (e.g., a=8.868588963765105) to realize the exponential characteristic with substantially no error. FIG. 10 is a schematic block diagram of a variable gain amplifier circuit such that a small-signal transconductance of each OTA is proportional to the square root of a driving current as mentioned above according to an embodiment. Herein the constant a may be an inverse coefficient of the exponential characteristic (x and voltage gain $G_v$), and may determine the slope of the line when the voltage gain is indicated in dB (decibel). The voltage gain $G_v$ of the VGA including OTAs (11 and 12) is $$G_V = \sqrt{\frac{I_{01}\left\{1+\tanh\left(\frac{x}{a}\right)\right\}}{I_{02}\left\{1-\tanh\left(\frac{x}{a}\right)\right\}}} \quad (48)$$

from $G_V=g_{m1}/g_{m2}$, when transconductances ($g_{m1}$ and $g_{m2}$) of first and second OTAs (11 and 12) are proportional to the square root of the driving currents of the OTAs (11 and 12). Also, when transconductances ($g_{m1}$ and $g_{m2}$) of first and second OTAs (11 and 12) are proportional to the square root of the driving currents of the OTAs (11 and 12), the voltage gain $G_V$ may be $$G_V = \frac{I_{o1}\{1 + \tanh(\frac{x}{a})\}}{I_{o2}\{1 - \tanh(\frac{x}{a})\}}. \tag{49}$$

In the following, for simplicity driving current ($I_{o1}=I_{o2}=I_0$) is assumed in the VGA 1000 shown in FIG. 10. The hyperbolic tangent function (tan h(x/a)) is almost equal to the characteristic of the output current from a bipolar differential pair.

Figure 12:
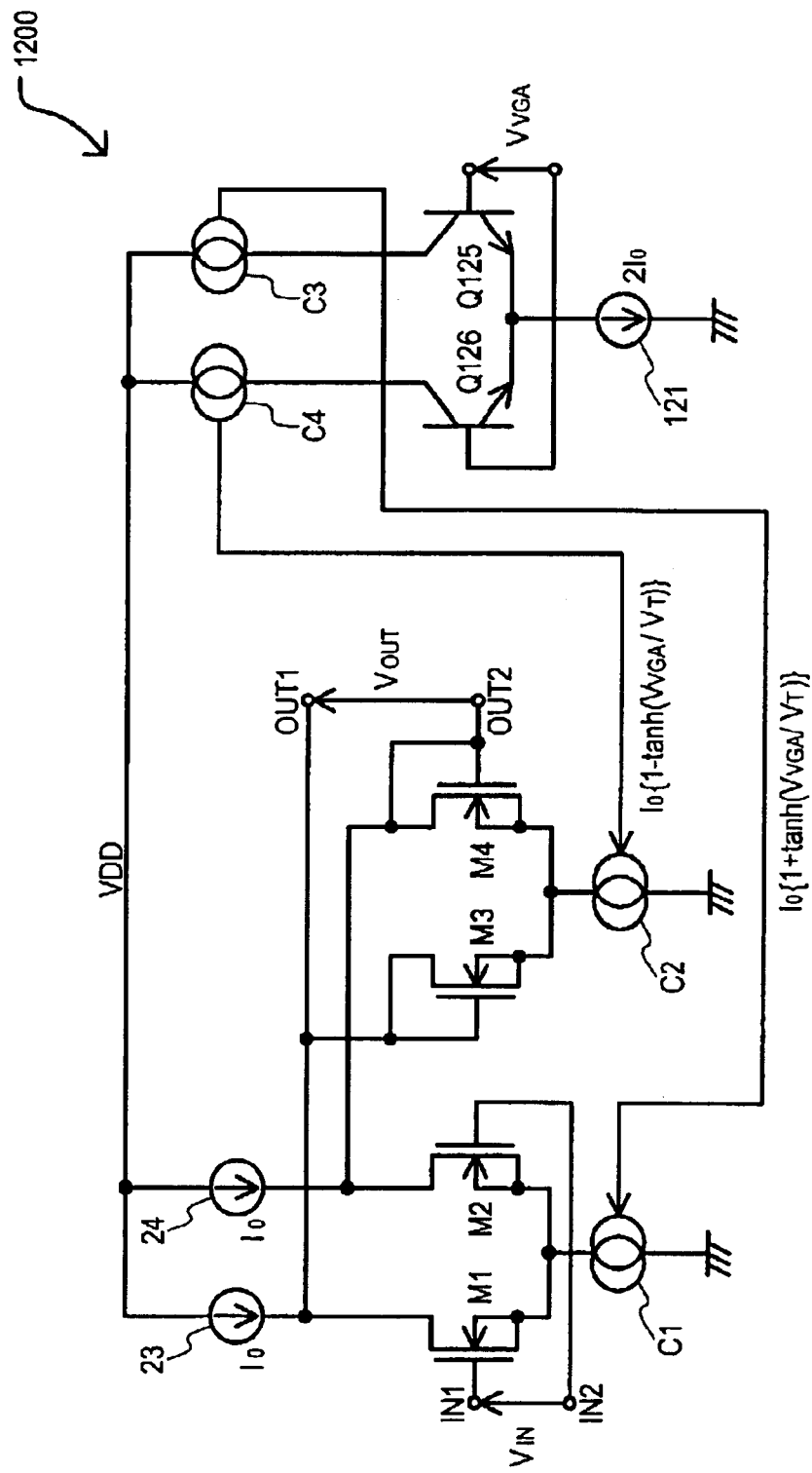
FIG. 12 is a circuit schematic diagram of a variable gain amplifier circuit (VGA) according to an embodiment.

Referring now to FIG. 12, a circuit schematic diagram of a variable gain amplifier circuit (VGA) according to an embodiment is set forth and given the general reference character 1200. VGA 1200 may be an example where driving current ($I_{o1}=I_{o2}=I_0$) is assumed in the VGA 1000 shown in FIG. 10 and the hyperbolic tangent function (tan h(x/a)) is almost equal to the characteristic of the output current from a bipolar differential pair.

In VGA 1200, a first OTA may include n-type IGFETs (M1 and M2) and a second OTA may include n-type IGFETs (M3 and M4) configured as in FIG. 2. Drive currents of first and second OTAs may be provided from an output end of current mirror circuits (C1 and C2), respectively. Current mirrors (C1 and C2) may have an input end connected to an output end of current mirror circuits (C3 and C4), respectively. Bipolar transistors (Q126 and Q125) and current sources (C3, C4, and 121) may form a current biasing circuit. Current source 121 may be connected between a ground potential and a common emitter connection of bipolar transistors (Q125 and Q126). Current source 121 may be a constant current source having a current value $2I_0$. Current source C3 may be connected between power supply VDD and a collector of bipolar transistor Q125. Current source C4 may be connected between power supply VDD and a collector of bipolar transistor Q126. An output end of current sources (C3 and C4) may be connected to an input end of current sources (C1 and C2). Bipolar transistors (Q126 and Q125) may differentially receive a voltage $V_{VGA}$ at respective bases. In this way, currents ($I_0\{1+\tan h(V_{VGA}/V_T)\}$ and $I_0\{1-\tan h(V_{VGA}/V_T)\}$) may be provided from an output end of current sources (C3 and C4), respectively, to an input end of current sources (C1 and C2), respectively. Thus, current sources (C1 and C2) may form current mirrors and may mirror current in current sources (C3 and C4), respectively. For example, the size ratios of transistors on an output side in current mirror circuits (C1 and C2) and that of transistors on the input side may be set to different values of K:1 and M:1. In this way, the current drive provided to first and second OTAs may be ($I_{o1}\{1+\tan h(V_{VGA}/VT)\}$ and $I_{o2}\{1-\tan h(V_{VGA}/V_T)\}$), respectively, where ($I_{o1}=K\cdot I_0$, $I_{o2}=M\cdot I_0$).

Figure 15:
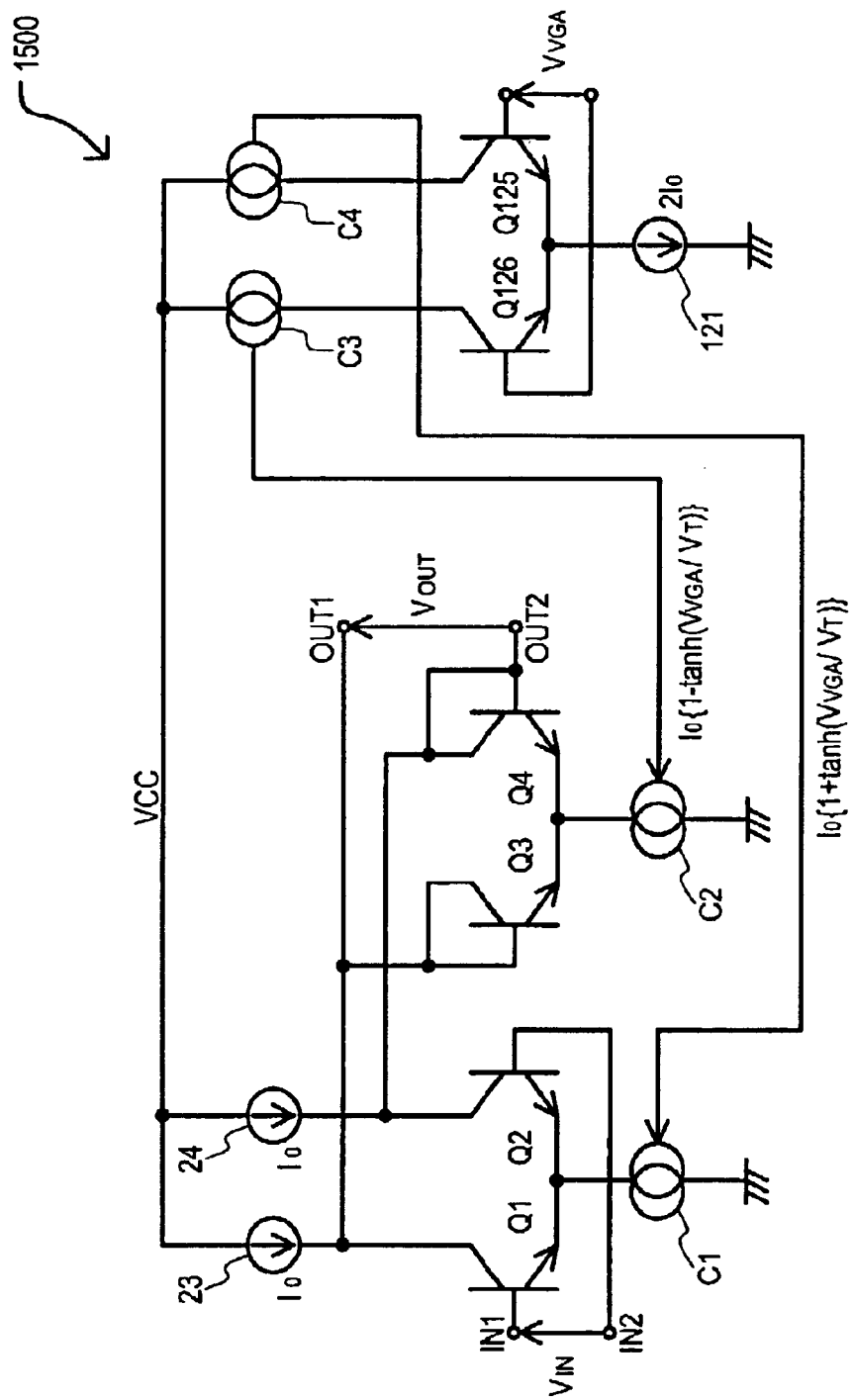
FIG. 15 is a circuit schematic diagram of a variable gain amplifier circuit (VGA) according to an embodiment.

Referring now to FIG. 15, a circuit schematic diagram of a variable gain amplifier circuit (VGA) according to an embodiment is set forth and given the general reference character 1500. VGA 1500 may be similar to VGA 1200 of FIG. 12 except, a first OTA may include bipolar transistors (Q1 and Q2) and a second OTA may include bipolar transistors (Q3 and Q4) configured as in FIG. 7.

With such a configuration, a VGA 1500 having an exponential characteristic of the voltage gain $V_G$ based on the identity $$e^x = \frac{1 + \tanh(\frac{x}{2})}{1 - \tanh(\frac{x}{2})} \tag{50}$$

may be realized.

A VGA may be formed similar to VGA 1500 in which a vertically stacked arrangement may be used. In a vertically stacked arrangement, collectors of differential pair (Q126 and Q125) may be connected to the common emitters of differential transistor pairs (Q1–Q2 and Q3–Q4), respectively. In this configuration current sources (C1 to C4) forming current mirror circuits may be eliminated.

In the above embodiment, a voltage gain of a VGA may be continuously variable. Next, a specific example of a VGA circuit for receiving a control signal from a microprocessor will be described below. In the example described below, a discrete voltage gain may be set instead of incorporating an AGD (Automatic Gain Control) loop.

For example, supposing that a VGA is set to have a voltage gain with a median of 1 (0 dB), and with a variable gain width of ±6 dB. Referring now to FIG. 13, table calculation values (a=8.868) of the drive current when the voltage gain is varied at 0.5 dB step from −6 dB to 6 dB around a median of 0 dB is set forth.

From FIG. 13, the drive current ($I_0\{1+\tan h(x/a)\}$) for a first OTA including n-type IGFETs (M1 and M2) is increased successively from $I_{00}=0.4015257I_0$ by $I_{12}=0.038221I_0$, $I_{11}=0.040765I_0$, $I_{10}=0.043276I_0$, $I_9=0.045712I_0$, $I_8=0.048033I_0$, $I_7=0.050193I_0$, $I_6=0.052148I_0$, $I_5=0.053856I_0$, $I_4=0.055276I_0$, $I_3=0.056373I_0$, $I_2=0.0507121I_0$, $I_1=0.0575I_0$, $I_1=0.0575I_0$, $I_2=0.057121I_0$, $I_3=0.056373I_0$, $I_4=0.055276I_0$, $I_5=0.053856I_0$, $I_6=0.052148I_0$, $I_7=0.050193I_0$, $I_8=0.048033I_0$, $I_9=0.045712I_0$, $I_{10}=0.043276I_0$, $I_{11}=0.040765I_0$, and $I_{12}=0.038221I_0$.

Conversely, the drive current for a second OTA including n-type IGFETs (M3 and M4) is decreased successively from $I_{00}=1.5984743I_0$ by $I_{12}=0.038221I_0$, $I_{11}=0.040765I_0$, $I_{10}=0.043276I_0$, $I_9=0.045712I_0$, $I_8=0.048033I_0$, $I_7=0.050193I_0$, $I_6=0.052148I_0$, $I_5=0.053856I_0$, $I_4=0.055276I_0$, $I_3=0.056373I_0$, $I_2=0.057121I_0$, $I_1=0.0575I_0$, $I_1=0.0575I_0$, $I_2=0.057121I_0$, $I_3=0.056373I_0$, $I_4=0.055276I_0$, $I_5=0.053856I_0$, $I_6=0.052148I_0$, $I_7=0.050193I_0$, $I_8=0.048033I_0$, $I_9=0.045712I_0$, $I_{10}=0.043276I_0$, $I_{11}=0.04765I_0$, $I_{12}=0.038221I_0$.

With the above configuration, the voltage gain of the VGA can be varied at 0.5 dB step, for example, from −6 dB to 6 dB.

Figure 14:
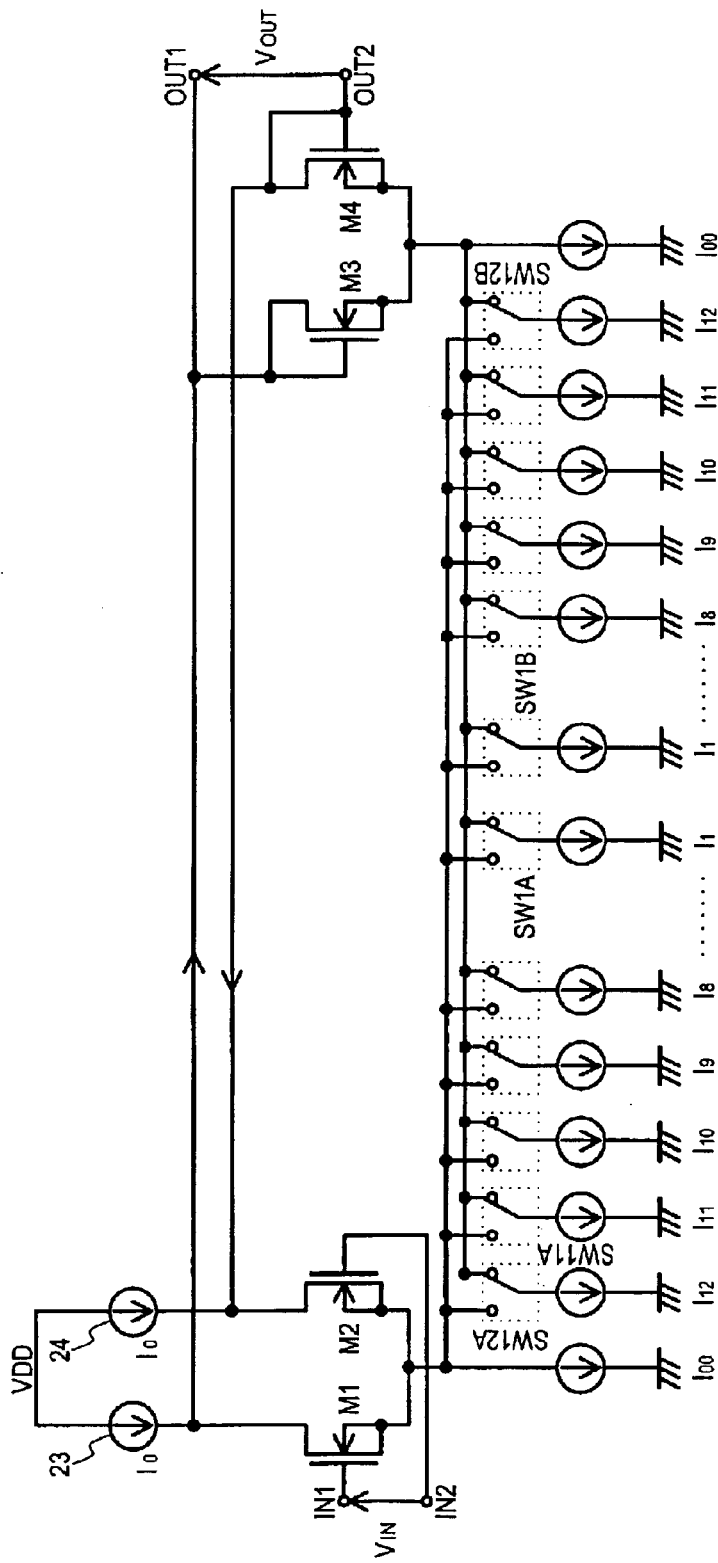
FIG. 14 is a circuit schematic diagram showing a circuit configuration of a variable gain amplifier circuit (VGA) for implementing a discrete gain value based on an identity according to an embodiment.

FIG. 14 is a circuit schematic diagram showing a circuit configuration of a variable gain amplifier circuit (VGA) for implementing a discrete gain value based on an identity according to an embodiment.

Referring now to FIG. 14, a drive current source for a first and second OTA may have two series of 13 current sources in which the sum of $I_{00}=0.4015257I_0$, $I_{12}=0.038221I_0$, $I_{11}=0.040765I_0$, $I_{10}=0.043276I_0$, $I_9=0.045712I_0$, $I_8=0.048033I_0$, $I_7=0.050193I_0$, $I_6=0.052148I_0$, $I_5=0.053856I_0$, $I_4=0.055276I_0$, $I_3=0.056373I_0$, $I_2=0.057121I_0$, and $I_1=0.0575I_0$ may be equal to $I_0$, in which the second current source to fourteenth current source or the fourteenth current source to the second current source may be switched from the first OTA to the second OTA or from the second OTA to the first OTA by switches (SW12A–SW1A and SW1B–SW12B). In this way, the voltage gain of a VGA may be made variable at 0.5 dB step from 0 dB to −6 dB and/or from 0 dB to 6 dB. An electric current $I_{00}$ may be always supplied to first and second OTAs. In FIG. 14, switches (SW12A–SW1A) may switch an electric current ($I_{12}$–$I_1$) and switches (SW1B–SW12B) may switch an electric current ($I_1$–$I_{12}$) on or off in response to a control signal from a microprocessor (not shown).

Similarly, n-type IGFETs (M1 to M4) may be replaced with bipolar transistors (Q1 to Q4). In this case, the calculation values of a driving current as shown in FIG. 13 may be obtained from an instance where a voltage gain is varied at 1 dB step from −12 dB to 12 dB around a median of 0 dB to provide a variable gain width of a VGA being ±12 dB.

It is understood that the embodiments described above are exemplary and the present invention should not be limited to those embodiments. Specific structures should not be limited to the described embodiments.

As described above, according to the embodiments, a VGA having a voltage gain of an exponential characteristic with less error may be realized. According to the embodiments, this may be accomplished because a variable gain characteristic of a VGA may be proportional to a driving current ratio of two OTAs or its square root. By varying a driving current ratio of a OTA, a voltage gain of $$G_V = \sqrt{\frac{1+x}{1-x}}$$

or $$G_V = \frac{1+x}{1-x}$$

or $$G_V = \sqrt{\frac{1+\tanh\left(\frac{x}{a}\right)}{1-\tanh\left(\frac{x}{a}\right)}}$$

or $$G_V = \frac{1+\tanh\left(\frac{x}{a}\right)}{1-\tanh\left(\frac{x}{a}\right)}$$

may be obtained (a is a constant).

According to the embodiments, a second effect is that a VGA having a voltage gain that may be essentially independent of temperature affects may be realized. According to the embodiments, a variable gain characteristic of a VGA is proportional to a driving current ratio of two OTAs or its square root. In this way, temperature variations may be essentially cancelled.

According to the embodiments, a third effect is that a VGA may be operable from a low power supply voltage. According to the embodiments, a circuit configuration may include a differential transistor-pair which may not be stacked in series, thereby the operating voltage may be reduced.

According to the embodiments, a fourth effect is that a VGA have reduced current consumption. According to the embodiments, a VGA may have a simple circuit configuration with a smaller circuit scale.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A variable gain amplifier circuit, comprising:
   a first OTA (Operational Transconductance Amplifier) for providing an electric current essentially proportional to a differential input voltage; and
   a second OTA for accepting the electric current of the first OTA and converting current to voltage, the second OTA including a second OTA input terminal connected to a second OTA output terminal wherein
   an output voltage level can be varied by making a driving current of the first OTA variable or a driving current of the second OTA variable.

2. The variable gain amplifier circuit according to claim 1, wherein:
   a first transconductance of the first OTA is essentially proportional to a square root of a first driving current of the first OTA and a second transconductance of the second OTA is essentially proportional to a square root of a second driving current of the second OTA.

3. The variable gain amplifier circuit according to claim 1, wherein:
   a first transconductance of the first OTA is essentially proportional to a first driving current of the first OTA and a second transconductance of the second OTA is essentially proportional to a second driving current of the second OTA.

4. The variable gain amplifier circuit according to claim 1, wherein:
   a size of transistors in the first OTA is different from a size of transistors in the second OTA.

5. The variable gain amplifier circuit according to claim 1, wherein:
   a variable range of a first driving current of the first OTA is different from a variable range of a second driving current of the second OTA.

6. The variable gain amplifier circuit according to claim 1, wherein:
   at least one of the first OTA or the second OTA includes a plurality of OTAs arranged in parallel.

7. The variable gain amplifier circuit according to claim 1, wherein:
   a substantial portion of a variable component of a first driving current of the first OTA is varied in accordance with a hyperbolic tangent function (tan h(x/a)) (a is a constant); and
   a substantial portion of a variable component of a second driving current of the second OTA is varied in accordance with the hyperbolic tangent function (tan h(x/a)).

8. The variable gain amplifier circuit according to claim 7, wherein:
   the substantial portion of the variable component of a first driving current of the first OTA is varied in discrete values in accordance with the hyperbolic tangent function; and
   the substantial portion of the variable component of a second driving current of the second OTA is varied discretely in accordance with the discrete values of the hyperbolic tangent function.

9. A variable gain amplifier circuit, comprising:
   a first OTA including first and second input terminals coupled to receive a differential input voltage; and
   a second OTA including a third input terminal for receiving a first current from a first output terminal of the first OTA and a fourth input terminal for receiving a second current from a second output terminal of the first OTA, the second OTA includes a third output terminal connected to the third input terminal and a fourth output terminal connected to the fourth input terminal wherein the first OTA has a first small-signal transconductance proportional to a first driving current of the first OTA and the second OTA has a second small-signal transconductance proportional to a second driving current of the second OTA and a voltage gain is varied by varying at least one of the first driving current or the second driving current.

10. The variable gain amplifier circuit according to claim 9, further including:

a plurality of switches coupled in series with a plurality of current sources for varying the first driving current and the second driving current wherein the first and second OTA are provided with an essentially constant current having a first current value and the voltage gain is varied by varying the first driving current and the second driving current in accordance with the plurality of switches.

11. The variable gain amplifier circuit according to claim 10, wherein:

the sum of current values switched by the plurality of switches and varying the first driving current and second driving current are such that the first driving current is essentially $I_{01}\{1+\tan h(x/a)\}$, and the second driving current is essentially $I_{02}\{1-\tan h(x/a)\}$ ($I_{01}$ and $I_{02}$ are essentially constant current values, tan h is a hyperbolic tangent function, a is a constant, and x is a variable in the range $-1<x<1$).

12. The variable gain amplifier circuit according to claim 11, wherein:

$I_{01}$ and $I_{02}$ are essentially the same value.

13. The variable gain amplifier circuit according to claim 9, wherein:

the first OTA has a first small-signal transconductance proportional to a square root of the first driving current of the first OTA and the second OTA has a second small-signal transconductance proportional to a square root of the second driving current of the second OTA and a voltage gain is varied by varying at least one of the first driving current or the second driving current.

14. A variable gain amplifier circuit, comprising:

a first OTA including first and second input terminals coupled to receive a differential input voltage; and a second OTA including third input terminal for receiving a first current from a first output terminal of the first OTA and a fourth input terminal for receiving a second current from a second output terminal of the first OTA, the second OTA includes a third output terminal connected to the third input terminal and a fourth output terminal connected to the fourth input terminal wherein the first OTA has a first small-signal transconductance proportional to a square root of a first driving current of the first OTA and the second OTA has a second small-signal transconductance proportional to a square root of a second driving current of the second OTA and a voltage gain is varied by varying at least one of the first driving current or the second driving current and if the first driving current is $I_{01}(1+x)$, and the second driving current is $I_{02}(1-x)$ ($I_{01}$ and $I_{02}$ are essentially constant current values, and x is a variable in the range $-1<x<1$), a voltage gain $G_v$ is given such as $$G_V = \sqrt{\frac{I_{01}(1+x)}{I_{02}(1-x)}}$$

or has a value essentially proportional to the above value of $G_V$.

15. The variable gain amplifier circuit according to claim 14, wherein:

$I_{01}$ and $I_{02}$ are essentially the same value.

16. A variable gain amplifier circuit, comprising:

a first OTA including first and second input terminals coupled to receive a differential input voltage; and a second OTA including third input terminal for receiving a first current from a first output terminal of the first OTA and a fourth input terminal for receiving a second current from a second output terminal of the first OTA, the second OTA includes a third output terminal connected to the third input terminal and a fourth output terminal connected to the fourth input terminal wherein the first OTA has a first small-signal transconductance proportional to a first driving current of the first OTA and the second OTA has a second small-signal transconductance proportional to a second driving current of the second OTA and a voltage gain is varied by varying at least one of the first driving current or the second driving current and if the first driving current is $I_{01}(1+x)$, and the second driving current is $I_{02}(1-x)$ ($I_{01}$ and $I_{02}$ are essentially constant current values, and x is a variable in the range $-1<x<1$), a voltage gain $G_v$ is given such as $$G_V = \frac{I_{01}(1+x)}{I_{02}(1-x)}$$

or has a value essentially proportional to the above value of $G_V$.

17. The variable gain amplifier circuit according to claim 16, wherein:

$I_{01}$ and $I_{02}$ are essentially the same value.

18. A variable gain amplifier circuit, comprising:

a first OTA including first and second input terminals coupled to receive a differential input voltage; and a second OTA including third input terminal for receiving a first current from a first output terminal of the first OTA and a fourth input terminal for receiving a second current from a second output terminal of the first OTA, the second OTA includes a third output terminal connected to the third input terminal and a fourth output terminal connected to the fourth input terminal wherein the first OTA has a first small-signal transconductance proportional to a first driving current of the first OTA and the second OTA has a second small-signal transconductance proportional to a second driving current of the second OTA and a voltage gain is varied by varying at least one of the first driving current or the second driving current and if the first driving current is $I_{01}\{1+\tan h(x/a)\}$, and the second driving current is $I_{02}\{1-\tan h(x/a)\}$ ($I_{01}$ and $I_{02}$ are essentially constant current values, tan h is a hyperbolic tangent function, a is a constant, and x is a variable in the range −1<x<1), a voltage gain $G_v$ is given such as $$G_V = \sqrt{\frac{I_{01}\left\{1+\tanh\left(\frac{x}{a}\right)\right\}}{I_{02}\left\{1-\tanh\left(\frac{x}{a}\right)\right\}}}$$

or has a value essentially proportional to the above value of $G_v$.

19. The variable gain amplifier circuit according to claim 18, wherein:
$I_{01}$ and $I_{02}$ are essentially the same value.

20. A variable gain amplifier circuit, comprising:
a first OTA including first and second input terminals coupled to receive a differential input voltage; and
a second OTA including third input terminal for receiving a first current from a first output terminal of the first OTA and a fourth input terminal for receiving a second current from a second output terminal of the first OTA, the second OTA includes a third output terminal connected to the third input terminal and a fourth output terminal connected to the fourth input terminal wherein the first OTA has a first small-signal transconductance proportional to a first driving current of the first OTA and the second OTA has a second small-signal transconductance proportional to a second driving current of the second OTA and a voltage gain is varied by varying at least one of the first driving current or the second driving current and if the first driving current is $I_{01}\{1+\tan h(x/a)\}$, and the second driving current is $I_{02}\{1-\tan h(x/a)\}$ ($I_{01}$ and $I_{02}$ are essentially constant current values, tan h is a hyperbolic tangent function, a is a constant, and x is a variable in the range −1<x<1), a voltage gain $G_v$ is given such as $$G_V = \frac{I_{01}\left\{1+\tanh\left(\frac{x}{a}\right)\right\}}{I_{02}\left\{1-\tanh\left(\frac{x}{a}\right)\right\}}$$

or has a value essentially proportional to the above value of $G_v$.

21. The variable gain amplifier circuit according to claim 20, wherein:
$I_{01}$ and $I_{02}$ are essentially the same value.

22. A variable gain amplifier circuit, comprising:
a first OTA having a first IGFET (insulated gate field effect transistor) including a first IGFET drain, a first IGFET gate, and a first IGFET source and a second IGFET including a second IGFET drain, a second IGFET gate, and a second IGFET source, the first IGFET source and the second IGFET source commonly coupled to a first current source, the first IGFET gate and second IGFET gate coupled to receive a differential input voltage at first and second input terminals, respectively, the first IGFET drain coupled to a third current source, and the second IGFET drain coupled to a fourth current source;
a second OTA including a third IGFET including a third IGFET drain, a third IGFET gate, and a third IGFET source and a fourth IGFET including a fourth IGFET drain, a fourth IGFET gate, and a fourth IGFET source, the third IGFET source and the fourth IGFET source are commonly coupled to a second current source, the third IGFET gate and third IGFET drain are commonly coupled to the first IGFET drain and a first output terminal, the fourth IGFET gate and fourth IGFET drain are commonly coupled to the second IGFET drain and a second output terminal; and
a current value of the third and fourth current sources is essentially $I_0$, a current value of the first current source is essentially $I_0(1+x)$, and a current value of the second current source is essentially $I_0(1-x)$, where $I_0$ is essentially a constant current value and x is a variable in the range −1<x<1.

23. The variable gain amplifier circuit according to claim 22, wherein:
the first OTA further includes a fifth IGFET having a fifth IGFET drain, a fifth IGFET gate, and a fifth IGFET source and a sixth IGFET having a sixth IGFET drain, a sixth IGFET gate, and a sixth IGFET source, the fifth IGFET drain and sixth IGFET drain commonly coupled to the second IGFET source, the fifth IGFET source and sixth IGFET source commonly coupled to the first IGFET source, the fifth IGFET gate coupled to the first input terminal, and the sixth IGFET gate coupled to the second input terminal.

24. The variable gain amplifier circuit according to claim 22, wherein:
the first OTA further includes a fifth IGFET having a fifth IGFET drain coupled to the second IGFET source, a fifth IGFET gate coupled to receive a control potential, and a fifth IGFET source coupled to the first IGFET source.

25. The variable gain amplifier circuit according to claim 22, wherein:
a current value of the third and fourth current sources is essentially $I_0/2+\beta V_{IN}^2/4$, the current value of the first current source is essentially $I_0+\beta V_{IN}^2/2$, where $I_0$ is essentially a constant current, $\beta$ is a transconductance parameter of an IGFET, and $V_{IN}$ is the differential input voltage.

26. A variable gain amplifier circuit, comprising:
a first OTA having a first bipolar transistor including a first transistor collector, a first transistor base, and a first transistor emitter and a second bipolar transistor including a second transistor collector, a second transistor base, and a second transistor emitter, the first transistor emitter and the second transistor emitter commonly coupled to a first current source, the first transistor base and second transistor base coupled to receive a differential input voltage at first and second input terminals, respectively, the first transistor collector coupled to a third current source, and the second transistor collector coupled to a fourth current source;
a second OTA including a third bipolar transistor including a third transistor collector, a third transistor base, and a third transistor emitter and a fourth bipolar transistor including a fourth transistor collector, a fourth transistor base, and a fourth transistor emitter, the third transistor emitter and the fourth transistor emitter are commonly coupled to a second current source, the third transistor base and third transistor collector are commonly coupled to the first transistor collector and a first output terminal, the fourth transistor base and fourth transistor collector are commonly coupled to the second transistor collector and a second output terminal; and
a current value of the third and fourth current sources is essentially $I_0$, the current value of the first current source is essentially $I_0(1+x)$, and the current value of the second current source is essentially $I_0(1-x)$, where $I_0$ is essentially a constant current value and x is a variable in the range $-1<x<1$.

27. The variable gain amplifier circuit according to claim 26, wherein:
the first and second bipolar transistors have a first emitter ratio different from 1; and
the third and fourth bipolar transistors have a second emitter ratio different from 1.

28. The variable gain amplifier circuit according to claim 26, wherein:
the first OTA further includes
a fifth bipolar transistor having a fifth collector coupled to the first collector, a fifth base coupled to receive a common voltage at a third input terminal, and a fifth emitter coupled to the first emitter;
a sixth bipolar transistor having a sixth collector coupled to the second collector, a sixth base coupled to receive the common voltage at the third input terminal, and a sixth emitter coupled to the second emitter; and
the first bipolar transistor and the fifth bipolar transistor have a first emitter ratio different from 1 and the second bipolar transistor and the sixth bipolar transistor have a second emitter ratio different from 1.

29. A variable gain amplifier circuit, comprising:
a first OTA having a first IGFET (insulated gate field effect transistor) including a first IGFET drain, a first IGFET gate, and a first IGFET source and a second IGFET including a second IGFET drain, a second IGFET gate, and a second IGFET source, the first IGFET source and the second IGFET source commonly coupled to a first current source, the first IGFET gate and second IGFET gate coupled to receive a differential input voltage at first and second input terminals, respectively, the first IGFET drain coupled to a third current source, and the second IGFET drain coupled to a fourth current source;
a second OTA including a third IGFET including a third IGFET drain, a third IGFET gate, and a third IGFET source and a fourth IGFET including a fourth IGFET drain, a fourth IGFET gate, and a fourth IGFET source, the third IGFET source and the fourth IGFET source are commonly coupled to a second current source, the third IGFET gate and third IGFET drain are commonly coupled to the first IGFET drain and a first output terminal, the fourth IGFET gate and fourth IGFET drain are commonly coupled to the second IGFET drain and a second output terminal; and
a current value of the third and fourth current sources is essentially $I_0$, the current value of the first current source is essentially $I_0\{1+\tan h(x/a)\}$, and the current value of the second current source is essentially $I_0\{1-\tan h(x/a)\}$, where $I_0$ is essentially a constant current value, tan h is a hyperbolic tangent function, a is a constant, and x is a variable in the range $-1<x<1$.

30. The variable gain amplifier circuit according to claim 29, further including:
a first bipolar transistor having a first emitter, first base, and first collector;
a second bipolar transistor having a second emitter, second base, and second collector;
the first emitter and second emitter are commonly coupled to a fifth current source having a current value of essentially $2I_0$;
a control voltage received between the first base and the second base;
the first bipolar transistor providing the current value of the first current source at the first collector and the second bipolar transistor providing the current value of the second current source at the second collector.

31. A variable gain amplifier circuit, comprising:
a first OTA having a first bipolar transistor including a first transistor collector, a first transistor base, and a first transistor emitter and a second bipolar transistor including a second transistor collector, a second transistor base, and a second transistor emitter, the first emitter and the second transistor emitter commonly coupled to a first current source, the first transistor base and second transistor base coupled to receive a differential input voltage at first and second input terminals, respectively, the first transistor collector coupled to a third current source, and the second transistor collector coupled to a fourth current source;
a second OTA including a third bipolar transistor including a third transistor collector, a third transistor base, and a third transistor emitter and a fourth bipolar transistor including a fourth transistor collector, a fourth transistor base, and a fourth transistor emitter, the third transistor emitter and the fourth transistor emitter are commonly coupled to a second current source, the third transistor base and third transistor collector are commonly coupled to the first transistor collector and a first output terminal, the fourth transistor base and fourth transistor collector are commonly coupled to the second transistor collector and a second output terminal; and
a current value of the third and fourth current sources is essentially $I_0$, the current value of the first current source is essentially $I_0\{1+\tan h(x/a)\}$, and the current value of the second current source is essentially $I_0\{1-\tan h(x/a)\}$, where $I_0$ is essentially a constant current value, tan h is a hyperbolic tangent function, a is a constant, and x is a variable in the range $-1<x<1$.

32. The variable gain amplifier circuit according to claim 31, further including:
a fifth bipolar transistor having a fifth emitter, fifth base, and fifth collector;
a sixth bipolar transistor having a sixth emitter, sixth base, and sixth collector;
the fifth emitter and sixth emitter are commonly coupled to a fifth current source having a current value of essentially $2I_0$;
a control voltage received between the fifth base and the sixth base;
the fifth bipolar transistor providing essentially the current value of the first current source at the fifth collector and the sixth bipolar transistor providing essentially the current value of the second current source at the sixth collector.

* * * * *